(12) United States Patent
Nakagawa

(10) Patent No.: US 9,741,839 B1
(45) Date of Patent: Aug. 22, 2017

(54) GATE STRUCTURE OF THYRISTOR

(71) Applicant: Powerex, Inc., Youngwood, PA (US)

(72) Inventor: Tsutomu Nakagawa, Irwin, PA (US)

(73) Assignee: Powerex, Inc., Youngwood, PA (US)

( * ) Notice: Subject to any disclaimer, the term of this patent is extended or adjusted under 35 U.S.C. 154(b) by 0 days.

(21) Appl. No.: 15/187,986

(22) Filed: Jun. 21, 2016

(51) Int. Cl.
  *H01L 29/00* (2006.01)
  *H01L 29/749* (2006.01)
  *H01L 29/08* (2006.01)
  *H01L 29/417* (2006.01)

(52) U.S. Cl.
  CPC ........ *H01L 29/749* (2013.01); *H01L 29/0834* (2013.01); *H01L 29/0839* (2013.01); *H01L 29/41716* (2013.01)

(58) Field of Classification Search
  CPC ............. H01L 29/749; H01L 29/41716; H01L 29/0839; H01L 29/0834
  See application file for complete search history.

(56) References Cited

U.S. PATENT DOCUMENTS

| | | | |
|---|---|---|---|
| 3,360,696 A * | 12/1967 | Desmond | H01L 29/747 257/119 |
| 4,559,551 A | 12/1985 | Nakagawa | |
| 4,567,502 A * | 1/1986 | Nakagawa | H01L 29/0619 257/339 |
| 4,586,070 A | 4/1986 | Nakagawa | |
| 4,639,276 A | 1/1987 | Nakagawa | |
| 4,794,441 A * | 12/1988 | Sugawara | H03K 17/567 257/124 |
| 4,881,118 A | 11/1989 | Niwayama et al. | |
| 5,128,742 A * | 7/1992 | Kao | H01L 29/7302 257/351 |
| 5,393,995 A | 2/1995 | Nakagawa et al. | |
| 6,411,133 B1 * | 6/2002 | Matsudai | H03K 5/2481 327/427 |
| 8,835,975 B1 * | 9/2014 | Veeramma | H01L 29/0684 257/107 |
| 2004/0164316 A1 * | 8/2004 | Nakashima | H01L 24/72 257/107 |

\* cited by examiner

*Primary Examiner* — Nikolay Yushin
(74) *Attorney, Agent, or Firm* — Buchanan Ingersoll & Rooney PC

(57) ABSTRACT

A thyristor device that can include a disc-shaped device comprising a semiconductor material forming alternating p-n-p-n type layers. The device can include a gate area extending from an external gate lead contact point to a plurality of thyristor units connected in parallel. Each thyristor unit can include at least one exposed pB layer portion to form at least one plural point to which gate current can be directed. Further, an insulator layer can be formed over the gate area to insulate at least a portion of the gate electrode from the pB layer so that displacement current can be directed to short dots and then to the plural points. Current entering each thyristor unit can generate a turned-on area at each thyristor unit that spreads throughout the thyristor device.

26 Claims, 22 Drawing Sheets

GATE STRUCTURE OF THYRISTOR

FIELD OF THE INVENTION

The disclosed invention relates to increasing the di/dt capability of a thyristor device (e.g., high voltage thyristor) by providing a distribution framework for the gate structure by which a plurality of turned-on areas can be used to increase the rate at which the turn-on area spreads throughout the device.

BACKGROUND OF THE INVENTION

A thyristor can be a solid-state semiconductor device with at least four layers of alternating n-type and p-type material. Generally, thyristors are utilized as electrical switches that turn on with the application of a threshold current or voltage. A typical thyristor can include three leads, which may be referred to as an anode, a cathode, and a gate, where the gate controls the current that flows between the anode and the cathode. A small trigger current applied at the gate can allow for a larger current to flow between the cathode and anode, thus allowing the thyristor to serve as a switch within an external circuit.

A thyristor can be forward blocking, reverse blocking, or forward conducting. In a forward blocking mode, the anode is positive biased, the cathode is negative biased, and no current is supplied to the gate, thus no current can flow from the anode to the cathode. If no current can flow from the anode to the cathode, the thyristor is switched off. In a reverse blocking mode, the anode is negative biased and cathode is positive biased, and thus no current can flow through the thyristor. In a forward conducting mode, the anode is positive biased, the cathode is negative biased, and current is supplied to the gate. In a forward conducting mode, the alternating n-type and p-type layers generate a conductive state via movement of electrons and holes until an emitter region is adequately charged to be turned-on (i.e., saturated). Once the emitter region, or at least a substantial portion of the emitter region, is turned-on, current can flow from the anode to the cathode. The charging of the layers occurs in a propagating manner such that the turned-on area "spreads" throughout the emitter region to transition the emitter region into a turned-on state. This is known as spreading of the turned-on area. A measure of the rate at which the turned-on area spreads can be the derivative current capability (the "current capability" or the "di/dt capability") of the thyristor.

The di/dt capability of a thyristor generally decreases as the blocking voltage (i.e., the maximum voltage applied to the thyristor before turning on) increases. This inverse relationship between the di/dt capability and the blocking voltage can occur because of the low spreading rate of the initial turned-on area and an increase of power loss at the turned-on area, both of which occur as the voltage applied to the thyristor is increased. As the result, the di/dt capability of a conventional high voltage thyristor, e.g., a 6 kilo-Volt ("kV") class thyristor, is approximately 100 Amps/microsecond ("A/µs").

Within this disclosure, a thyristor ("Th") may be referred to as a silicon-controlled rectifier ("SCR"). Some skilled in the art reserve the term SCR for a particular type of thyristor, while others use SCR synonymously with thyristor. Within this disclosure the terms thyristor and SCR are synonymous and can be interchanged.

As noted above, a thyristor can be a semiconductor device that may include four layers comprising alternating p-n-p-n type material, which are generally denoted as pE layer, nB layer, pB layer, and nE layer. FIG. 1A shows a top view of a conventional thyristor device; FIG. 1B shows a schematic diagram of the conventional thyristor of FIG. 1A; FIG. 1C shows a cross sectional view along the A-A line of the conventional thyristor of FIG. 1A; and FIG. 1D shows a cross sectional view along the B-B line of the conventional thyristor of FIG. 1A.

As shown in FIGS. 1C-1D, an original n-type semiconductor wafer (e.g., silicon wafer) can form an n-base layer (or nB layer) 1, where the pE layer 2 may be formed on one side of the nB layer 1 so as to form a lower surface 8 of the device and the p-base layer (or pB layer) 3 may be formed on an opposite side of the nB layer 1 so as to form an upper surface 7 of the device. The nE layer 4 can then be selectively formed on the pB layer 3 so that portions of the pB layer 3 remain exposed. Some of the exposed pB layer 3 portions may then be configured as short dots 5 (e.g., an exposed pB layer 3 covered with an oxide), and at least one other exposed pB layer 3 portion can be configured as a gate area 6. Generally, the short dots 5 are distributed within the nE layer 4, and the gate area 6 is surrounded by the nE layer 4, where the nE layer 4 surrounding the gate area 6 can be referred to as the auxiliary nE layer 4'. Note that FIGS. 1C-D are partial cross sections through a middle of the device, and thus the gate electrode 11 and gate area 6 are in the middle of the device.

The auxiliary nE layer 4' may be electrically connected to the gate area 6 at the upper surface 7 by metal to form an auxiliary thyristor cathode electrode 14. The auxiliary thyristor cathode electrode 14 can be further connected to the gate area 6 so as to be formed around the auxiliary nE layer 4', wherein the region of the device comprising the auxiliary thyristor cathode electrode 14, the gate area 6, and the auxiliary nE layer 4' can be referred to as the auxiliary thyristor region 15. The short dots 5 are in ohmic contact with their respective exposed nE layer 4 by a cathode metal to form the main thyristor cathode electrode 9. The gate electrode 11 is formed by a metal making ohmic contact with the gate area 6, but without direct contact to the gate area's 6 respective nE layer 4. The resultant structure facilitates the forward and reverse blocking capabilities of the thyristor.

The short dots 5 can also be used to improve forward blocking voltage capability and time derivative voltage capability ("voltage capability" or "dv/dt capability") of the thyristor. For example, short dots 5 can make a parallel bypass resistance path underneath the pB-nE junction (see FIG. 1C) so that hot leakage current and displacement current, due to the dv/dt, flow through the bypass resistance path to the main thyristor cathode electrode 9. If the short dots 5 are not between the pB-nE junction 19, excess holes would exist at the pB-nB junction 19 during a forward blocking mode of the thyristor. Consequently, the excess holes would pile up underneath the nE layer 4, generating excess charge and biasing the pB-nE junction 19 forward. As the result, the thyristor may lose forward blocking capability, whereby the thyristor would turn-on when lower voltages are applied, which is estimated from the resistivity of nB layer 1. Thus, use of short dots 5 can decrease the pile up of holes underneath of nE layer 4, resulting in an improvement to the forward blocking and dv/dt capability of the conventional thyristor.

When a threshold plus (or positive) gate signal is applied to the gate area 6, the thyristor transitions from voltage blocking mode to low resistance mode, whereby current begins to flow. This can be referred to as the turn-on mode. As explained above, when a region becomes adequately charged, that region saturates with charge and propagates throughout the layers to generate a turned-on area. Once enough of the main thyristor region 16 is turned-on, current can begin to flow from the anode electrode 10 to the cathode electrode 9. The beginning of current flow through the thyristor can be referred to as the initial turn-on stage. With conventional thyristors, the initial turned-on area is limited to an area that is periphery to the gate area 6, or the gate periphery 17. As a consequence, the initial turned-on area spreads gradually over time to the main thyristor cathode electrode 9 and to the cathode electrode 9 (e.g., approximately 0.1 millimeter per micro-second ("mm/µs")).

The rate at which the turn-on area spreads depends on the time it takes to electrically charge and modulate the injected holes of the nB layer 1 by the electrons from the pE and nE layers 2, 4. The time required to charge the holes increases as the thickness of the nB layer 1 increases, and the thickness of the nB layer 1 increases as the blocking voltage increases. Therefore, the rate at which the turned-on area spreads decreases as blocking voltage increases. Furthermore, as the blocking voltage increases, the actual applied voltage required to operate the thyristor (i.e., the applied switching voltage) increases, which means that the voltage applied within the circuit connected to the thyristor also increased. As a consequence, there is an increase in current supplied to the thyristor during the initial turn-on stage, as well as an increase of instantaneous power loss of the product voltage. The instantaneous power loss is a function of both instantaneous voltage v(t) and instantaneous current i(t), and the current i(t) depends on the rate of rise of on-state current (di/dt). From these relationships and the structure of the prior art device, one can appreciate that a combination of a low rate at which the turned-on area spreads and a high instantaneous power loss of conventional high voltage devices result in a reduced of di/dt capability for conventional thyristor devices.

With the prior art device, the main current that flows to the auxiliary thyristor region 15 is distributed to the main thyristor periphery 18 that faces toward the gate electrode 11 (i.e., distributed to the region just outside the main thyristor region 16 that is most proximal to the gate electrode). In general, the periphery length of the auxiliary gate facing the main thyristor region 16 is longer than the emitter periphery length of the auxiliary thyristor region 15. As a result, the main current flows only to the gate periphery 17 during the initial turned-on stage, and then must flow through the auxiliary thyristor region 15 to be distributed to the main thyristor periphery 18. As noted above, the period of time for this to occur increases as the blocking voltage increases. In other words, the rate at which the turn-on area spreads to the main thyristor periphery 18 decreases as the blocking voltage of increases. The spread of the turned-on area, and thus the gate current, is slow enough to cause a build-up of electrical power at the auxiliary thyristor region 15, leading to a concentration of power consumption at the initial turn on-area of the auxiliary thyristor region 15 during the initial turn-on stage. This can be a particularly troublesome problem with high voltages (i.e., use of high voltage thyristors).

Increasing the gate current ("$I_G$") may improve the di/dt capability, but only by a marginal amount. For example, if an $I_G$ that is three to five times greater than the minimum threshold current ("$I_{GT}$") is used to achieve the turn-on mode for the device, the initial turned-on area may be increased. Yet, the initial turned-on area still remains at or near the gate periphery 18. Thus, despite the application of high $I_G$, the di/dt capability of, for example, a conventional 6.5 kV thyristor still hovers around 100 A/µs, whereas a di/dt capability of greater than 100 A/µs is required for most practical applications. One reason for this marginal improvement in di/dt capability is the failure to sufficiently reduce power consumption at the auxiliary thyristor region 15. One way to reduce power consumption is to facilitate the spread of the initial turned-on area to the main thyristor periphery 18 at a faster rate. However, as explained above, the initial turned-on area with the prior art thyristor cannot spread to the main thyristor periphery 18 quick enough.

Other prior art thyristor configurations include placing a high density of short dots 5 at the main thyristor periphery 18. As can be seen by FIGS. 1C-1D, the auxiliary thyristor region 15 has a limited area, and each short dot 5 of the main thyristor periphery 18 serves as a path that can bypass displacement current created by dv/dt at the pB-nB junction 19 of the auxiliary thyristor gate area. In situations where the short dot 5 density at the main thyristor periphery 18 is the same as the short dot 5 density the main thyristor region 16, the displacement current that flows through the short dots 5 becomes greater than the current flowing through the short dots 5 in main thyristor region 16. As the result, the dv/dt capability decreases. A higher shot dot 5 density at the main thyristor periphery 18, however, can be applied to increase the dv/dt capability by reducing the voltage drop caused by the displacement current flowing through the region underneath of the main thyristor periphery 18 (or main emitter periphery) to each short dot 5.

However, the high density short dot 5 layout at the main thyristor periphery 18 also increases the current required to make the entire main periphery 18 of the thyristor turn-on all at once. This results in an increased amount of time required for the main current flow to shift from the auxiliary thyristor region 15 to the main thyristor periphery 18, which again results in a decreased di/dt capability. While the introduction of a higher short dot 5 density layout may to improve dv/dt capability, the di/dt capability does not improve, and may even decrease. Thus, with such a higher short dot 5 density scheme, the di/dt capability still hovers around 100 A/µs for a conventional 6.5 kV thyristor, which is too low for most practical applications.

Further prior art thyristor configurations include a hybrid thyristor structure having an auxiliary thyristor gate, an interdigitated gate structure, and a grooved structure between the gate periphery and the main thyristor periphery 18. Without the grooved structure, the auxiliary thyristor region 15 is turned on by input of external gate current so that the turn-on current flows from the auxiliary thyristor region 15 to a periphery of the nE layer 4 (i.e., nE layer periphery) by way of an interdigitated gate electrode 11 and the nE layer periphery. When the voltage drop between the interdigitated gate electrode 11 and the nE layer 4 exceeds a threshold voltage for the pB-nE junction 19, the main thyristor periphery 18 initiates a turned-on mode. As noted above, the spread of the turned-on area between the gate periphery 17 to the main thyristor periphery 18 is decreased as the blocking voltage increases, and initial turn-on loss consumption concentrates at the gate periphery 17. To improve the initial turn-on loss consumption at the gate periphery 17, an auxiliary thyristor arrangement with a grooved structure between the gate periphery 17 and the main thyristor periphery 18 can be used. The grooved structure is effective to reduce the initial turn-on area along with the main thyristor periphery 18. Yet, even with this grooved structure, the increase in the di/dt capability is marginal, still hovering around 100 A/µs for a 6.5 kV class thyristor. This is because the main thyristor periphery 18 has a certain length, thus the initial turn-on current still concentrates to the periphery of the auxiliary thyristor until the main thyristor periphery turns on. Therefore, the groove structure does not have high di/dt capability, especially for high voltage thyristor applications. Further, the grooved structure has a weak point regarding dv/dt capability because of displacement current of the auxiliary thyristor and flows to the rest of the groove area. As a result, by adoption of the groove, dv/dt capability decreases.

In addition to the disadvantages described above, use of the conventional thyristor of FIG. 1A can be problematic when used in conjunction with snubber circuits and, in particular, resistance-capacitance snubber ("RC snubber" or "CR snubber") circuits. If a conventional thyristor in connection with a CR snubber circuit is turn-on by $I_G$, the snubber circuit first discharges current flow to the thyristor, after which the main circuit current flows to the thyristor. In such a situation, the auxiliary thyristor region 15 must be kept turned-on until the main current arrives at a threshold level to maintain a longer turned-on time at the main thyristor periphery 18. If the auxiliary thyristor region 15 is not kept on, then the auxiliary thyristor region 15 will have already transitioned to an off state due to a low main current flow. The off state will prevent spreading of the turn-on area to the main thyristor region 16, which may even lead to di/dt failure by the main current flow. In order to prevent the failure mode with such a configuration, an application of multiple gate input signals may be used, as opposed to one a gate input pulse used to initiate the turned-on mode. In addition, a special structure exhibiting different holding currents at the auxiliary thyristor region 15 and the main thyristor region 16 can be used. Yet, these require a more complex gate circuit design, increasing cost and complexity. It is therefore desired to generate a thyristor device exhibiting improved di/dt capability without relying on an auxiliary thyristor gate structure.

Another problem associated with the low di/dt characteristic exhibited by the prior art is that lower di/dt capabilities generally cause an increase in temperature at the initial turned-on area. Other factors may include applied voltage ("V") to the thyristor, current flow (i) applied to the thyristor, the volume of the initial turned-on area ("A"), and specific heat of the material comprising the thyristor. Nonetheless, the increase in temperature can cause further consumption power, and a low di/dt contributes to the increase in temperature. In addition, the avalanche voltage of conventional thyristors is also temperature dependent. For instance, with a conventional 6.5 kV thyristor, the avalanche voltage drastically decreases when the junction temperature exceeds 150 degrees Celsius. This demonstrated temperature dependency is more pronounced as the voltage applied is increased (i.e., with higher blocking voltage). Moreover, with conventional thyristors, the thyristor device tends to break over due to an increase of leakage current at the high junction temperature.

As noted above, the blocking voltage exhibits a temperature dependency. For example, within a certain temperature range, the blocking voltage can increase approximately 10%/100 C. FIG. 1E shows schematic blocking voltage tendencies associated with different voltage thyristor products (e.g., a 6500V product, a 4500V product, and a 2500V product). In the case of a 6500V product, the blocking voltage at 25 C decreases as temperature decreases, and increases as temperature increases. This is seen in FIG. 1E by the blocking voltage decreasing to 6000V at negative 100 C.° and increases to 6800V at positive 200 C°. But, as the temperature increases from around 200 C.°, the blocking voltage gradually decreases.

The tendency of the change in blocking voltage can depend on the impurity density of the n-base layer. As the impurity density decreases, the tendency becomes conspicuous and maximum voltage occurs at a lower temperature, as compared to highly doped impurity products. An increase in temperature for lower voltage products (e.g., 4500V and 2500V products) also increases the blocking voltage, but at a lower rate as compared to the 6500V product. Further, with the lower voltage products, the temperature at which the blocking voltage begins to decrease with a rise in temperature is a higher temperature, as compared to the higher voltage products. One reason for this can be due to the difference of collision probability of electrons and holes to silicon lattices. As a result, high blocking voltage products that have lower doped impurities can have a wider depletion layer width than low blocking voltage products. This may be one reason for the temperature dependency difference between high voltage and low voltage products. By a combination of the above temperature dependency of blocking voltage and increase of temperature rise of initial turn-on area as blocking voltage increases, the di/dt capability decreases as blocking voltage increases.

The present invention is directed toward overcoming one or more of the above-identified problems.

SUMMARY OF THE INVENTION

Disclosed is a thyristor device that can include a disc-shaped device comprising a semiconductor material forming alternating p-n-p-n type layers (e.g., nB layer, pE layer, pB layer, and nE layer). The device can include a gate area extending from an external gate lead contact point to a plurality of thyristor units connected in parallel. Each thyristor unit can include at least one exposed pB layer portion to form at least one plural point to which gate current can be directed. Further, an insulator layer can be formed over the gate area to insulate at least a portion of a gate electrode from the pB layer so that displacement current can be directed to short dots within the pB layer and then to the plural points. Current entering the thyristor device can be directed toward each thyristor unit to generate a turned-on area at each thyristor unit that spreads throughout the thyristor device, thereby creating a plural distribution framework.

As explained above, the low di/dt of conventional thyristors can cause the structure of the thyristor to act as a bottleneck for current flow, including current flow into the auxiliary thyristor gate. As a result, the addition of an auxiliary thyristor gate structure without including a plural distribution framework may not provide much benefit. Recognizing this problem, the inventor has invented the inventive thyristor structure to increase the di/dt capability by structuring the inventive thyristor device to generate a plurality of initial turned-on areas via a plural distribution framework. This plural distribution framework can increase the di/dt capability without use of an auxiliary gate structure.

In an exemplary embodiment, an inventive thyristor device can include a semiconductor structure with alternating p-n-p-n layers, the alternating p-n-p-n layers comprising: a nB layer having a pE layer disposed on one side of the nB layer to form a lower surface of the semiconductor structure; a pB layer disposed on an opposite side of the nB layer to form an upper surface of the semiconductor structure; and, a nE layer formed within the pB layer, wherein a gate area is a portion of the pB layer, which is located adjacent the nE layer, and the nE layer surrounds the gate area, wherein the nE layer is exposed to the upper surface and the pB layer is exposed to the lower surface; a cathode electrode located on at least a portion of the upper surface and formed by a first low ohmic resistance metal making ohmic contact with at least the nE layer; an anode electrode located on at least a portion of the lower surface and formed by a second low ohmic resistance metal making ohmic contact at least the pE layer; and, a gate electrode formed on at least a portion of the pB layer so as to be disposed over the gate area; wherein gate current entering the gate electrode flows to at least one particular plural part, which is located between the gate area and the nE layer to charge the alternating p-n-p-n layers and generate an initial turned-on area emanating from each of the at least one particular plural part. In some embodiments, the gate is formed as a hub with at least one spoke extending from the gate; each spoke forms an interdigitated gate electrode; and, each spoke comprises an arm and a distal end with the at least one particular plural part located at each distal end. In some embodiments, an insulator layer can be formed on top of at least a portion of the gate and underneath at least a portion of the gate electrode. In some embodiments, at least one short dot can be formed into the pB layer, wherein the insulator layer directs displacement current to the at least one short dot. In some embodiments, each distal end is structured as an individual thyristor unit connected in parallel. In some embodiments, a length and resistance of each arm is configured to supply a same magnitude of current to each individual thyristor unit simultaneously. In some embodiments, the insulator is formed on top of the gate except over the at least one particular plural part; and the gate electrode is an aluminum or other electrode metal formed on top of the insulator and on top of the at least one particular plural part. In some embodiments, the gate electrode makes ohmic contact with at least a portion of the at least one particular plural part, and wherein a remaining portion of the gate electrode is insulated from the gate by the insulator. In some embodiments, the gate electrode is a gate contact for the thyristor device. In some embodiments, the pB layer near the gate and the nE layer is shorted by the cathode electrode, except for the at least one particular plural part and except for an area near the at least one particular plural part. In some embodiments, an auxiliary thyristor structure can be formed by an auxiliary thyristor electrode connected to the nE layer that extends to the at least one particular plural part. In some embodiments, the auxiliary thyristor structure further comprises an auxiliary nE layer surrounding the auxiliary thyristor electrode, and wherein the auxiliary thyristor electrode makes ohmic contact with the auxiliary nE layer. In some embodiments, the pB layer near the gate and the nE layer is shorted by the cathode electrode, except for the at least one particular plural part and except for an area near the at least one particular plural part.

In another exemplary embodiment, an inventive thyristor can include a disc-shaped device comprising four layers of alternating p-n-p-n type material forming a nB layer having a pE layer disposed on one side of the nB layer to form a lower surface and a pB layer disposed on an opposite side of the nB layer to form an upper surface; a nE layer formed within the pB layer, wherein nE layer is exposed at the upper surface and the pE layer is exposed at the lower surface; at least one gate electrode formed on at least a portion of the pB layer, each gate electrode extending from a gate area and comprising an arm portion and a distal end portion, wherein the gate area is an external gate lead contact point; at least one short dot formed into the nE layer and located adjacent the gate, wherein a region of the nE layer that is adjacent the at least one short dot and most proximal the gate area is a nE layer periphery and the nE layer periphery surrounds the gate area; a cathode electrode disposed on at least a portion of the upper surface, the cathode electrode formed by a first low ohmic resistance metal making ohmic contact with the nE layer; an anode electrode disposed on at least a portion of the lower surface, the anode electrode formed by a second low ohmic resistance metal making ohmic contact with the pE layer; at least one particular plural part located at each distal end portion and formed into the nE layer adjacent the gate area; and an oxide insulator layer formed underneath at least a portion of the gate electrode and on top of at least a portion of the gate area, except at each distal end; wherein each distal end is configured as an individual thyristor unit. In some embodiments, each thyristor unit is connected in parallel. In some embodiments, the length and resistance of each arm are set to simultaneously provide each thyristor unit with a same magnitude current flowing into the thyristor device through the external gate lead contact point. In some embodiments, the at least one particular plural part is located between the gate and the nE layer periphery of each distal end. In some embodiments, each thyristor unit is located at a position within the disc-shaped device so that when the current flowing into the thyristor device through the external gate lead contact point reaches each individual thyristor unit, a turned-on area radiates from each individual thyristor unit to generate a plural distribution framework. In some embodiments, an extended p-base layer can be shorted to the cathode electrode by a metallization layer, wherein the pB layer near the gate area and the nE layer is shorted by the cathode electrode, except for the at least one particular plural part and except for an area near the at least one particular plural part. In some embodiments, an auxiliary electrode can be connected to the nE layer and extending to the at least one particular plural part.

In another exemplary embodiment, an inventive thyristor can include a pE layer, a nE layer, a pB layer, and a nB layer, forming a first silicon surface and a second silicon surface; wherein: the nE layer is exposed at the first silicon surface and the pE layer is exposed at the second silicon surface; both the nE layer and the pE layer makes ohmic contact with a low ohmic resistance metal to form a cathode electrode and an anode electrode; the gate area is part of the pB layer, which is also exposed to the first silicon surface, the gate area existing beside a periphery of the nE layer so that the exposed nE layer surrounds the gate area, the exposed gate area forming an interdigital finger shape into the nE layer; gate current flowing through the thyristor device does not evenly supply the nE periphery along the interdigital gate area and just supplies the gate current only to particular plural parts facing toward the nE layer. In some embodiments, the particular plural parts with a periphery of the interdigital finger are away from an external gate lead contact point of the thyristor device; and resistance from the gate lead contact point to the particular plural points is equivalent to each other, wherein the gate current just flows through the particular plural parts and flows evenly. In some embodiments, an insulator disposed onto the exposed gate except for at least a particular plural part or a plural of the exposed gate area; and aluminum or other metal electrode is formed onto the insulator and on the exposed particular plural part or plural gate of the interdigital pB layer, wherein the aluminum contacts ohmically and partially to the exposed the gate and another part of the aluminum is isolated by the insulator; wherein the aluminum on the insulator and exposed gate comprises a gate contact of the thyristor device. In some embodiments, a periphery of the exposed gate and the nE layer are at least shorted by the cathode electrode except near an area of the exposed gate and except the exposed gate. In some embodiments, the device can further include an auxiliary thyristor, wherein: the auxiliary thyristor comprises a gate electrode and an auxiliary nE layer that surrounds the gate electrode; and the gate electrode and an auxiliary emitter electrode ohmically contacts to the nE layer of the auxiliary thyristor and the auxiliary electrode extends to the particular plural parts on the insulator. In some embodiments, a periphery of the exposed gate and the nE layer are at least shorted by the cathode electrode except near an area of the exposed plural particular parts and the exposed plural particular parts.

While these potential advantages are made possible by technical solutions offered herein, they are not required to be achieved. The presently disclosed thyristor device can be implemented to achieve technical advantages, whether or not these potential advantages, individually or in combination, are sought or achieved.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

The above and other objects, aspects, features, advantages and possible applications of the present invention will be more apparent from the following more particular description thereof, presented in conjunction with the following Figures, in which.

DETAILED DESCRIPTION OF THE INVENTION

Figure 1A:
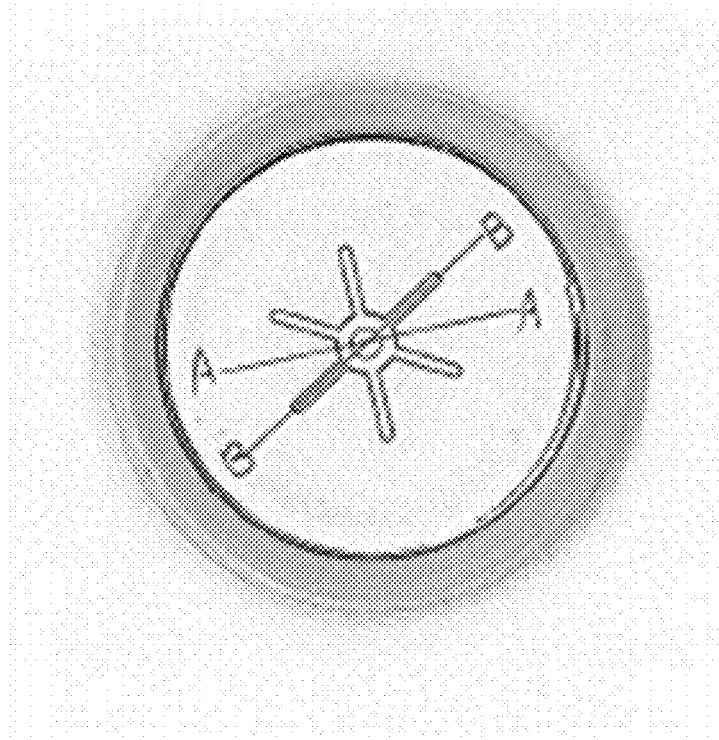
FIG. 1A shows a top view of a conventional thyristor device.

The following description is of an embodiment presently contemplated for carrying out the present invention. This description is not to be taken in a limiting sense, but is made merely for the purpose of describing the general principles and features of the present invention. The scope of the present invention should be determined with reference to the claims.

Various embodiments of the inventive thyristor device that can yield increased derivative current capability ("current capability" or "di/dt capability") for a thyristor without having to rely on an auxiliary thyristor structure. Yet, some embodiments can include the use of an auxiliary thyristor structure. Other embodiments can include a thyristor device exhibiting increased derivative voltage capacity ("voltage capability" or "dv/dt capability"), as well as di/dt capability. These and other embodiments are described in detail below.

Referring now to FIGS. 2A-2E, an exemplary inventive thyristor device is disclosed. The inventive thyristor device can be disc-shaped comprising a semiconductor material forming alternating p-n-p-n type layers of an nB layer 101 with a pE layer 102 formed on one side of the nB layer 101 so as to form a lower surface 108 of the device and a pB layer 103 formed on an opposite side of the nB layer 101 so as to form an upper surface 107 of the device. A nE layer 104 can then be selectively formed on the pB layer 103. A cathode electrode 109 and a gate electrode 111 may be located at an upper surface 107 of the device. An anode electrode 110 may be located at a lower surface 108 of the device. When in the forward conducting mode, current entering the gate area 106 may cause the alternating p-n-p-n type material to charge until the layer at a main thyristor region 116 (or main emitter region) is fully turned-on, facilitating current flow from the anode electrode 110 to the cathode electrode 109 and allowing current to flow through the inventive thyristor device.

The geometry of the inventive thyristor device is shown to be a disc shaped object having a hub 120 and spoke 125 configuration; however, other shapes and geometries can be used. The hub 120 can be an external gate lead contact point. Each spoke 125 has an arm 126 and a distal end (see FIG. 3B), where each distal end portion 127 includes a thyristor unit Th. Current can be supplied to the device through the gate electrode 111 located at the hub 120 and spoke 125 regions. Each thyristor unit Th can then be supplied current in a parallel manner (see FIG. 2B) so that each distal end portion 127 acts as a spot from which an initial turned-on area radiates.

Figure 1B:
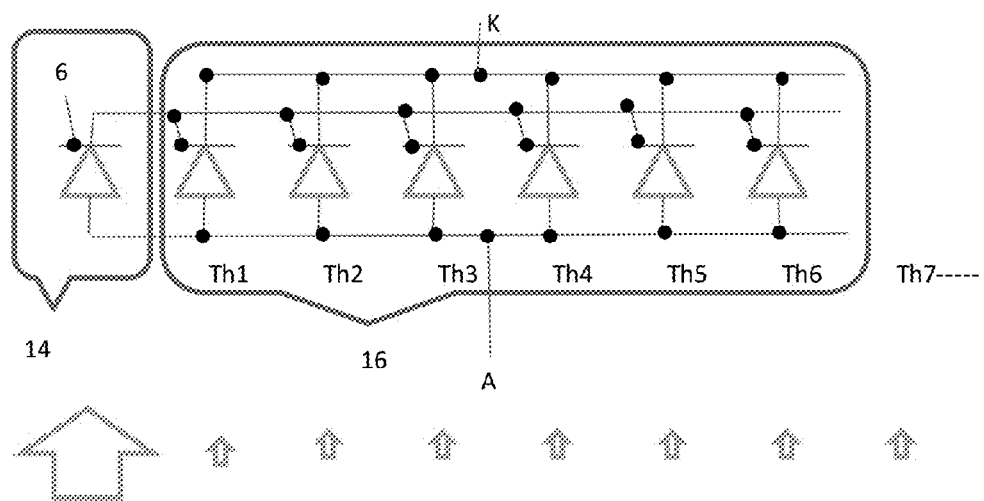
FIG. 1B shows a schematic diagram of the conventional thyristor of FIG. 1A.
Figure 1C:
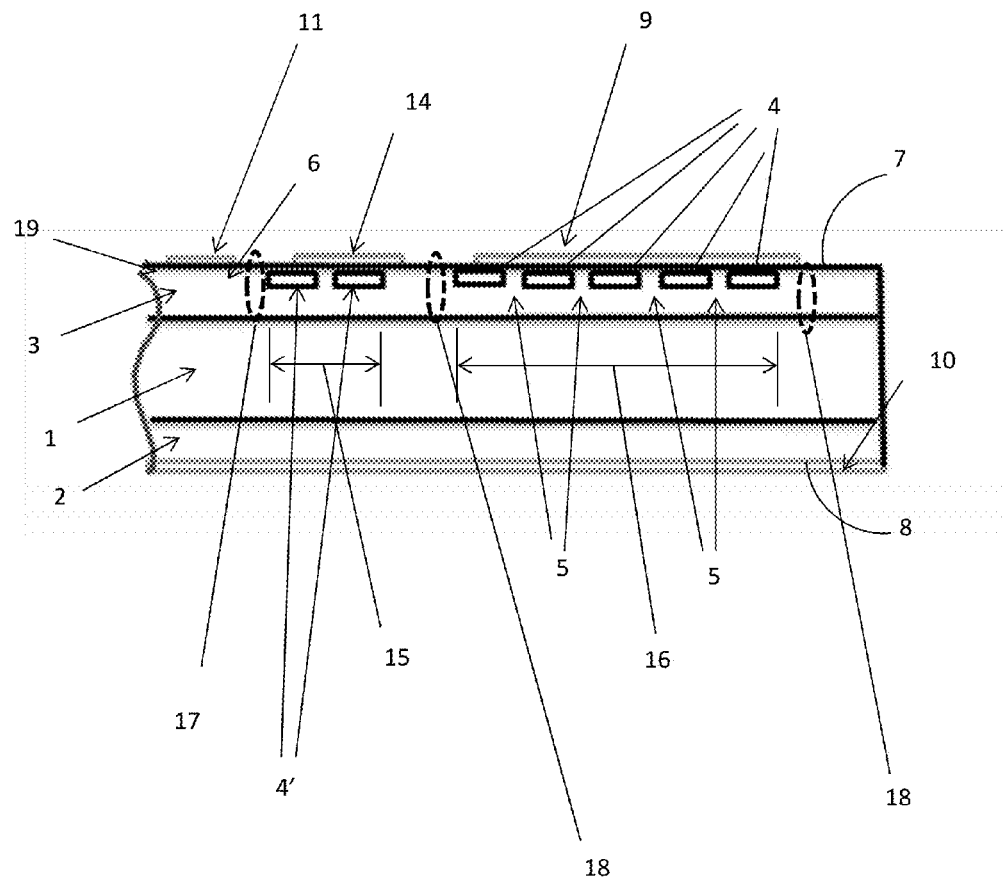
FIG. 1C shows a cross sectional view along the A-A line of the conventional thyristor of FIG. 1A.
Figure 1D:
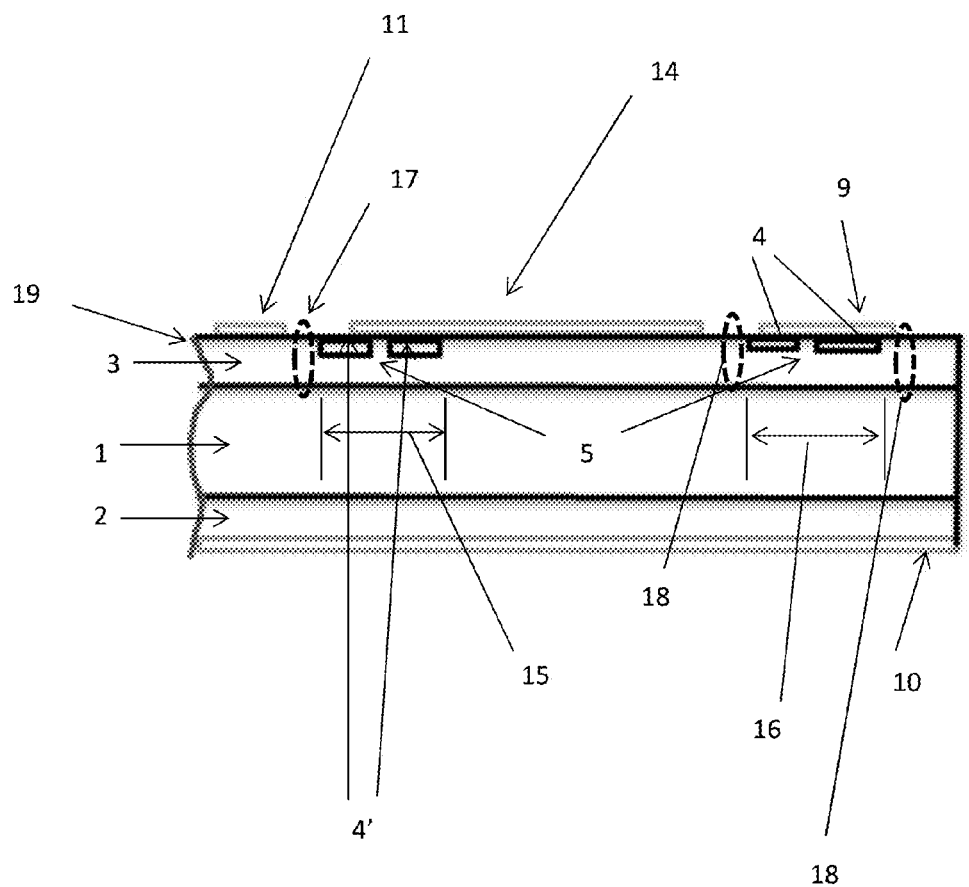
FIG. 1D shows a cross sectional view along the B-B line of the conventional thyristor of FIG. 1A; and, FIG. 1E shows schematic blocking voltage tendencies associated with different voltage products.
Figure 1E:
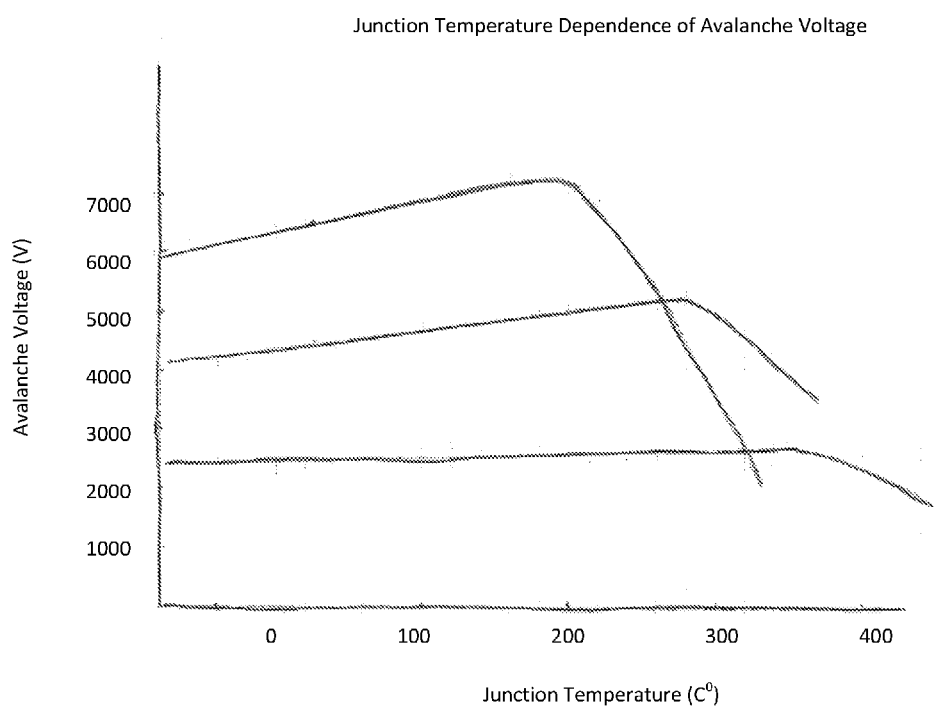

The prior art thyristor device of FIG. 1A exhibits a similar hub and spoke geometry (see FIG. 1A), but the thyristor units are not supplied current in a parallel manner (see FIG. 1B).

With the inventive thyristor device, each thyristor unit Th can commence an initial turned-on stage independently of another thyristor unit Th; however, due to the uniform flow of current to each distal end portion 127, each thyristor unit Th commences an initial turned-on stage simultaneously with each other thyristor unit Th. With each thyristor unit Th simultaneously commencing an initial turned-on stage, multiple turned-on areas can be generated simultaneously that emanate from each distal end portion 127. Thus, instead of one turned-on area spreading throughout the main emitter region, as with the prior art, a plurality of turned-on areas spread throughout the main emitter region simultaneously. In other words, the inventive thyristor device is configured to provide a plural distribution framework, where a plurality of turned-on areas creates the initial turned-on stage. Each distal end portion 127 can be positioned at a location of the device so as to allow the spreading of each individual turned-on area to turn-on the main emitter region of the entire device at one time. In other words, the distal end portions 127 can be located so that saturation of the entire main emitter region occurs when each individual turned-on area propagates to a region where another turned-on area exists. However, other spreading patterns, saturation schemes, and geometry optimizations can be used.

Generally, the length of each arm 126 corresponds to a resistance for current flow to the arm's 126 respective distal end portion 127 and, thus, the length of each arm 126 may be the same length of every other arm 126 to ensure that the current supplied to each thyristor unit Th is the same magnitude and to further ensure that each thyristor unit to be supplied that same magnitude of current simultaneously. However, as will be appreciated by one skilled in the art, the lengths of the arms 126 can be varied. Further, the resistance through each arm 126 can also be varied, regardless of the length. For example, the resistance and/or the length of any one arm 126 can be modified so as to control the magnitude and rate at which the current flowing through an arm 126 occurs. In some embodiments, the lengths and resistances of each distal end portion 127 is the same as every other distal end portion 127, regardless of the lengths and resistances of any one arm 126; however, the lengths and resistances of each distal end portion 127 can be similarly modified. The device shown in FIG. 2A has six spokes 125 radiating radially from a center of the disc. The more thyristor units that can be connected in parallel to simultaneously receive a uniform flow of current, the quicker the turned-on area can spread throughout the inventive thyristor device. However, it is understood that increasing the rate at which the turned-on area spreads may not be the only design factor. Other factors may include, but are not limited to, decreasing the rate at which the turned-on area spreads, or even causing certain portions of the device to be turned-on at a faster rate than other portions. Thus, it is contemplated for other geometries, the number of spokes 125, arm 126 lengths, distal end portion 127 lengths, arm 126 resistances, etc., can be used to achieve a desired spread rate for the turned-on area.

With the prior art device, the gate arrangement causes the single turned-on area to radiate slowly throughout the device, leading to a tendency to melt or cause other damage because of the high voltage and high current flow applications associated with high voltage thyristors. This is be appreciated by viewing the schematic in FIG. 1B, where the auxiliary SCR region 15 is usually destroyed when subjected to the current during the initial turned-on stage because many SCRs (Th1, Th2, Th3, etc.) form the main SCR region 16 to be connected to one auxiliary SCR region 15. The arrows leading into the gate arrangement are representative of the magnitude of current as it is distributed to the gate structure. FIG. 1B shows that the magnitude of current entering the auxiliary SCR region 15 is much larger than the magnitude of current entering each individual SCR of the main SCR region 16.

Figure 2A:
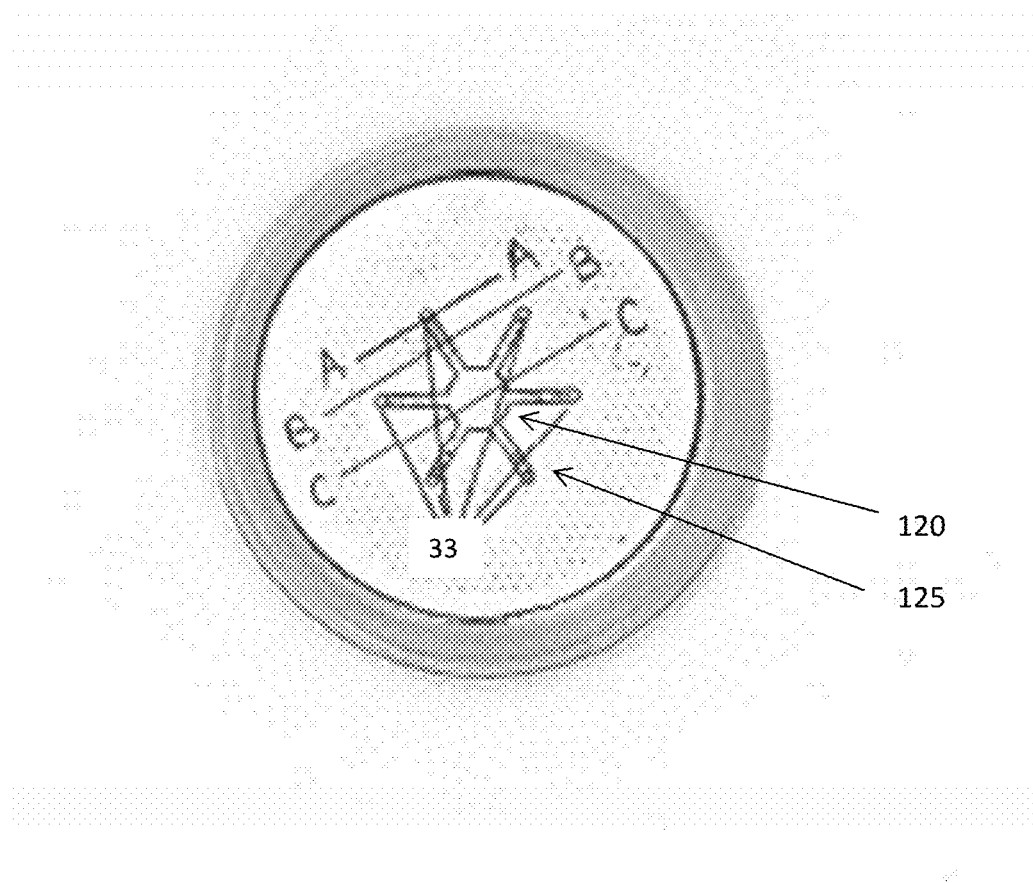
FIG. 2A shows a top view of an exemplary inventive thyristor device.
Figure 2B:
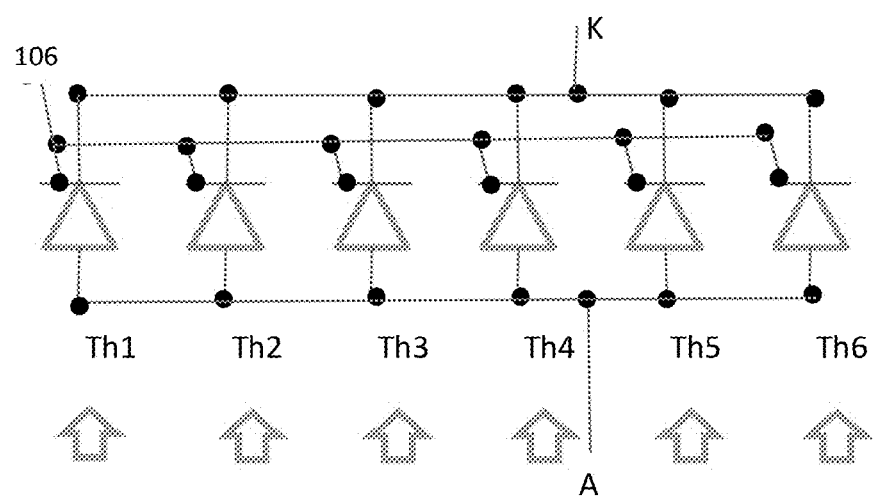
FIG. 2B shows a schematic diagram of the inventive thyristor of FIG. 2A.

Conversely, when a voltage is applied to the inventive thyristor device, the current is divided among the several thyristor units Th that have been connected in a parallel manner (see FIG. 2B). Again, the arrows leading into the gate arrangement are representative of the magnitude of current as it is distributed to the gate structure. FIG. 2B shows that the magnitude entering each individual thyristor unit (Th1, Th2, Th3, etc.) is larger than the current entering the individual SCRs in FIGS. 1B and is evenly distributed among all of the individual thyristor units Th. This may not only facilitate quicker turned-on area spreading for the device as a whole, it can also reduce or eliminate the risk of melting or other damage to the inventive thyristor device because the current is divided and quickly directed to each distal end portion 127.

Facilitating the above-referenced plural distribution framework is a plural distributed gate structure, whereby current flowing into the gate area 106, $I_G$, can be distributed to each thyristor unit Th located at the distal end portion 127 so that each thyristor unit Th simultaneously receives the same magnitude of current as each other thyristor unit Th so that each thyristor unit generates a turned-on area that spreads throughout the inventive thyristor device. Through this plural distribution framework, the di/dt capability of the inventive thyristor device, as a whole, increases by a factor that is the number of thyristor units Th connected in parallel. As will be explained in detail below, such a plural distribution framework can be achieved by creating an ohmic contact between the gate electrode 111 and at least one exposed portion the pB layer 103 to form at least one particular plural part 113. Further, the inventive thyristor device can include an oxide-insulator 112 layer to direct displacement current flow to short dots 105 to be further directed to the particular plural parts 113.

Figure 2C:
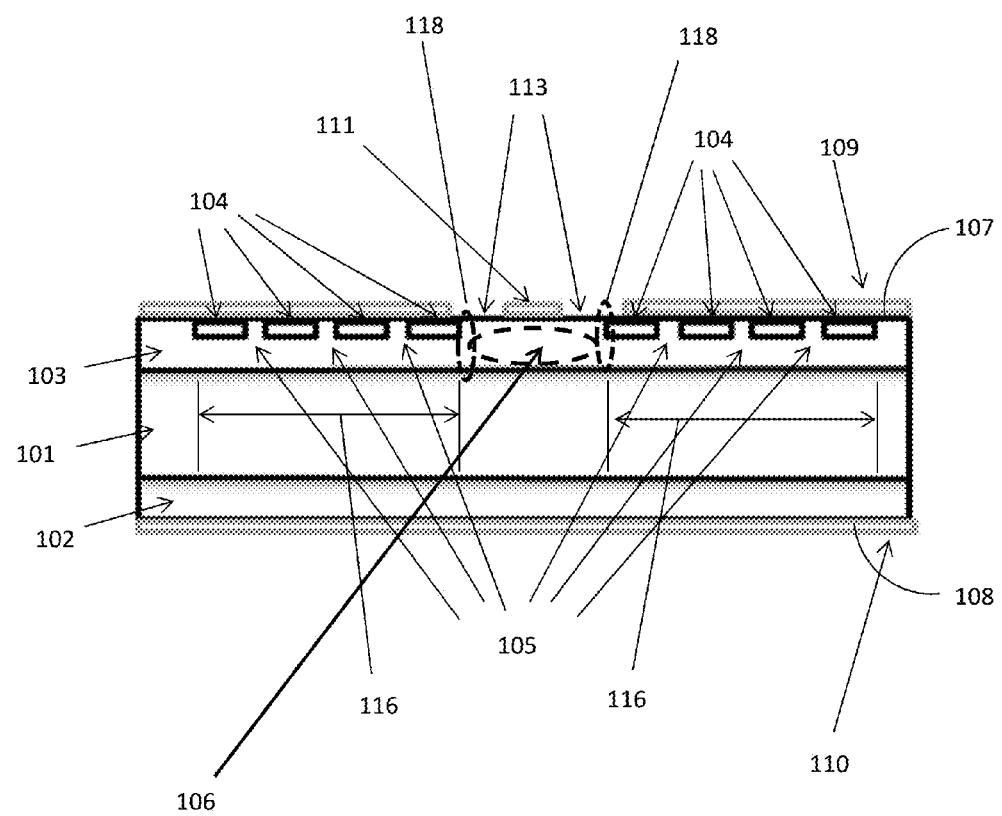
FIGS. 2C-2E show cross sectional views along the A-A line, B-B line, and C-C line, respectively, of the inventive thyristor device of FIG. 2A.
Figure 2D:
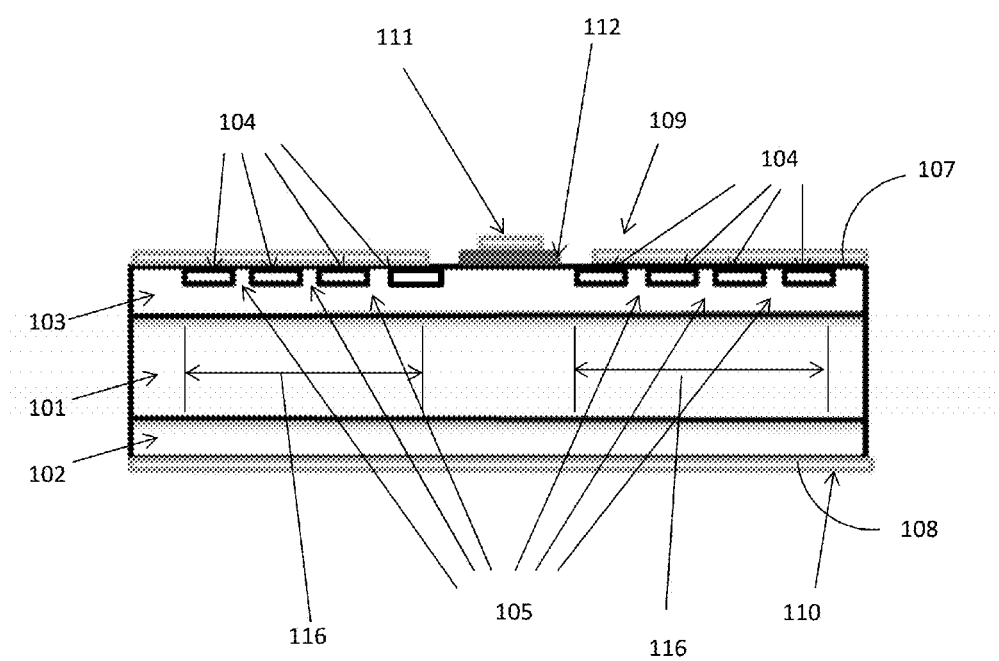
Figure 2E:
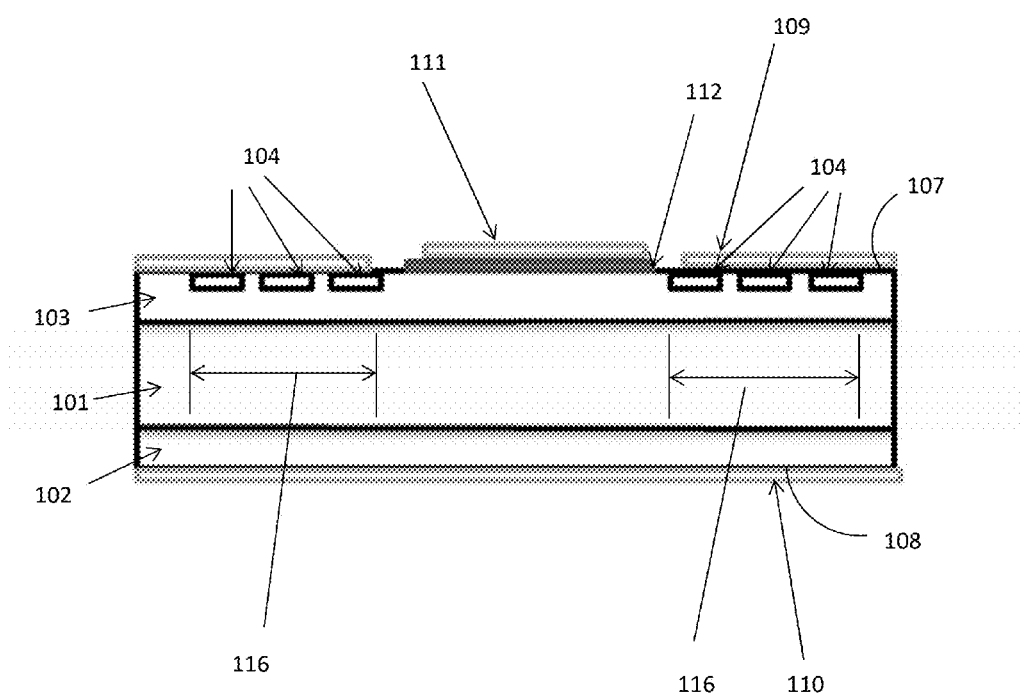

FIGS. 2C-2E show cross sectional views along the A-A line, B-B line, and C-C line, respectively, of the inventive thyristor device of FIG. 2A. FIG. 2C is a cross sectional view within the distal end portion 127 of a spoke 125, showing an individual thyristor unit Th. FIG. 2D is a cross sectional view within an arm portion 126 of a spoke 125. FIG. 2E is a cross sectional view within the gate area 106 located at the central portion of the disc. The gate electrode 111 can be aluminum or other metal electrode material forming an ohmic contact to the gate area 106. As noted above, the gate area 106 and the gate electrode 111 can complement the shape of the hub 120 and spoke 125, where the portions of the gate electrode 111 extending out along the spoke 125 can be referred to as an interdigitated portion of the gate electrode 111. The oxide or oxide-like insulator 112 can be formed underneath the gate electrode 111, except at the distal end portion 127. At each distal end portion 127, the gate electrode 111 can be in ohmic contact with at least one exposed portion of the pB layer 103 to form the particular plural part 113. When the anode electrode 110 is biased to plus (or positive), the cathode electrode 109 is bias to minus (or negative), and the gate electrode 111 is biased to plus (or positive), gate current can flow from the gate electrode 111 to cathode electrode 109, whereby the inventive thyristor device transitions to the forward conducting mode. In forward operating mode, $I_G$ can be divided in a parallel manner and supplied to the particular plural parts 113 of each thyristor unit Th via each interdigitated gate electrode 111. Further, displacement current can be caused to flow to the particular plural parts 113 of each thyristor unit Th via the short dots 105. Thus, when an individual thyristor unit Th is turned on, the current flows to the particular plural parts 113 of that individual thyristor unit Th, and then to the nE layer 104 that faces the each particular plural part 113 (i.e., the nE layer 104 located at the main thyristor periphery 118). In other words, the gate current does not directly flow to the entire main thyristor periphery 118, but rather flows to parts of the main thyristor periphery 118 (i.e., the parts that face each particular plural part 113 of the gate area 106).

With this configuration, the initial turned-on area of the inventive thyristor device is shared among the plurality of initial turned-on areas of each individual thyristor unit Th, which can then be distributed throughout the middle of the inventive thyristor device. As a result, the initial turn-on area of the inventive thyristor device spreads to the main thyristor region 116 for the entire device in a shorter time as compared to the prior art. For example, with an exemplary inventive thyristor device having six distributed gates (i.e., six individual thyristor units Th), the di/dt capability of the inventive thyristor device increases by a multiple of six as compared to a similar numbered gate structure of the prior art (see FIGS. 1A-1D). In other words, the di/dt capability of the inventive thyristor device can be increased by a multiple of the number individual thyristors units Th connected in parallel. Furthermore, the surge current is also increased without a risk of damaging the inventive thyristor device because the current is divided to be supplied in a parallel manner to each thyristor unit Th.

Figure 2F:
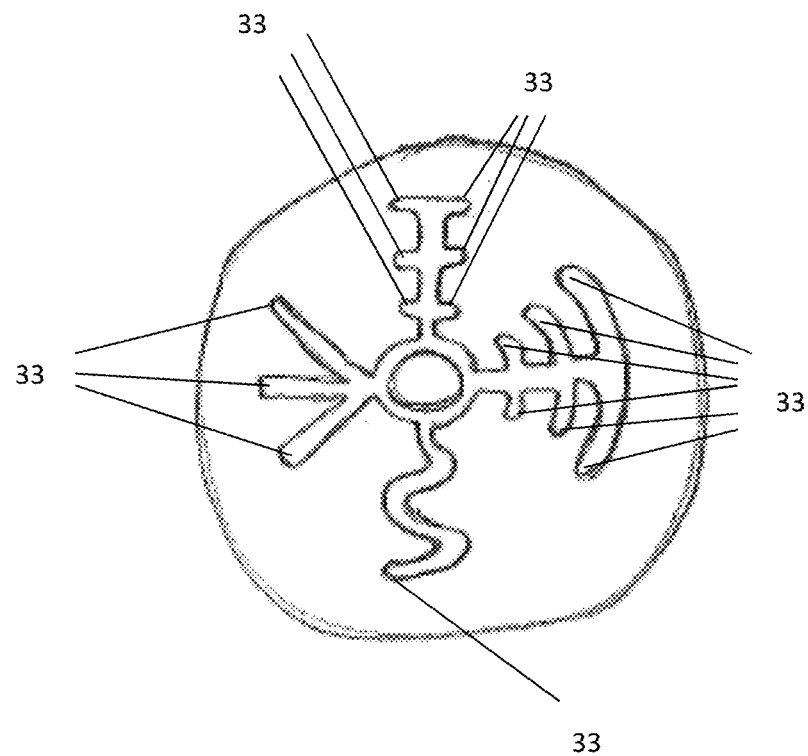
FIG. 2F illustrates various gate configurations and gate electrode 111 shapes that may be used with the inventive thyristor device.

It is contemplated for the inventive thyristor device to exhibit other gate configurations and gate electrode 111 shapes. For example, FIG. 2F illustrates various gate configurations and gate electrode 111 shapes that may be used with the inventive thyristor device. Further, any number of gate electrodes 111 can extend from the gate hub, and they need not extend in a radial manner. In addition, an inventive thyristor device can include differing gate electrode 111 shapes, as shown in FIG. 2F. In other words, each electrode shape can be the same (see FIG. 2A) or any one can be of a shape that is different from the shape of the other gate electrodes 111 (see FIG. 2F). While the inventive thyristor device shown exhibits a plural part 33 located at each distal end portion 127, any one distal end portion 127 can be free of a plural part 33. Further, a plural part 33 can be formed anywhere along the arm 126 in the alternative to or in addition to forming a plural part 33 at the distal end portion 127. Generating an inventive thyristor with various gate configurations and gate electrode 111 shapes can facilitate further modification and/or control of the rate at which the turn-on area spreads.

Referring to FIGS. 3A-3D, an exemplary method of producing the inventive thyristor device and the basic structures of the inventive thyristor device are shown. The gate electrode 111 can be configured to complement that of the hub 120 and spoke 125, with a hub portion 120 located in a central portion of the disc and a plurality of interdigitated extensions, each following along an individual arm 126 extending radially from the hub 120 to a distal end portion 127. The interdigitated extension can be seen in FIGS. 3B-3D. With the exemplary inventive thyristor device of FIG. 2A, there are six interdigitated gate electrodes 111, each extending from the hub 120 in a radial manner.

Figure 3A:
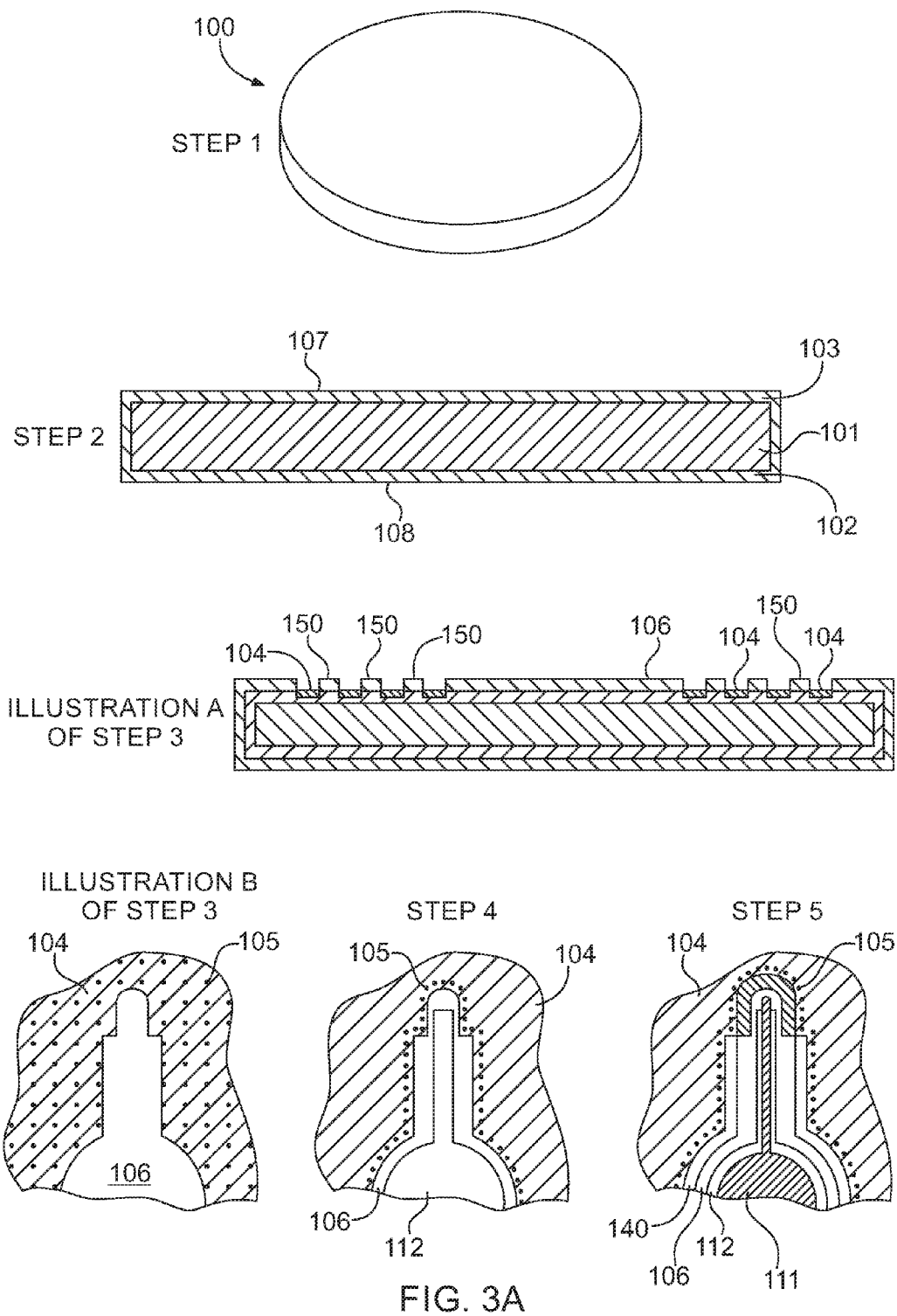
FIG. 3A shows an exemplary method of producing the inventive thyristor device and the basic structures of the inventive thyristor device.

FIG. 3A shows five basic steps to produce the inventive thyristor device. The first step can include generating a disc comprising an n-type semiconductor wafer 100 (e.g., a silicon wafer), where resistivity, thickness, and diameter may be selected based on blocking voltage and required average handling current. The second step can include performing proper cleaning processes that are known in the art, and then diffusing p-type dopants to desired depths from both the upper surface 107 and lower surface 108 of the wafer. In one embodiment, the depth can be approximately 90 micrometers ("μm"). Such doping can form a p-n-p layer construction (e.g., pE layer 102, nB layer 101, and pB layer 103 shown in FIGS. 2C-2E). After doping, the wafer disc can be oxidized in a furnace such that a 20,000 Angstrom oxide thickness is formed on at least one surface 107, 108.

Figure 3B:
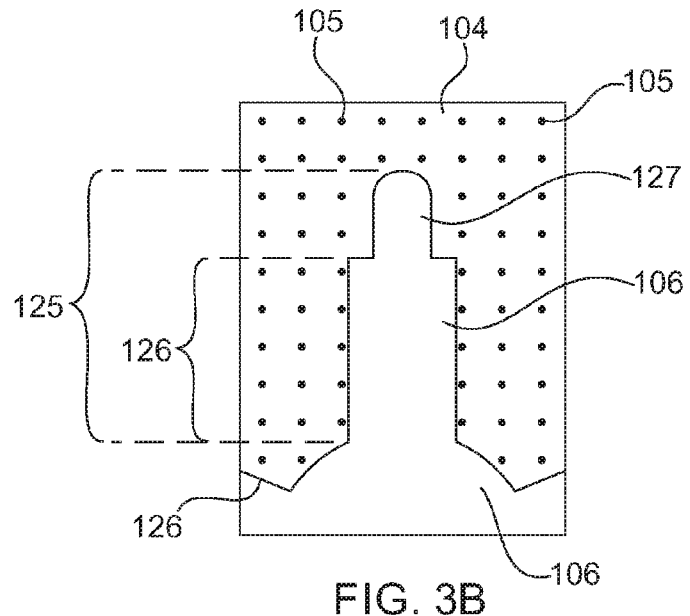
FIG. 3B shows an overview of a portion of the inventive thyristor device after phosphorous diffusion to form the nE layer has occurred.

The third step can include disposing a nE layer 104 on the pB layer 103 and the gate area 106 by diffusing phosphorus into the semiconductor wafer disc. However, before diffusing the phosphorous, short dots 105 may be formed so as to be distributed in the nE layer 104 and to expose the upper surface 107. Each short dot 105 can be an exposed area of the pB layer 103 that is covered with an oxide 150. The gate area 106 can be formed into the nE layer 104, where it may be structured as the hub 120 and interdigitated finger shape configuration mentioned above. After the gate area 106 is created, oxide formed on the interdigitated gate area 106 that is exposed on the upper surface 107 can be selectively patterned using photolithography (e.g., oxide photolithography) or similar processes so as to create some portions covered with oxide and some portions without being covered by the oxide, or oxide-portions and nonoxide-portions, respectively. After completing the photolithography process and any desired wafer cleaning process, the semiconductor wafer disc can be subjected to a phosphorous diffusion process, wherein phosphorus may be diffused into the semiconductor wafer through the nonoxide-portions to form the nE layer 104. The oxide-portions of the pB layers 103 exposed to the upper surface 107 form the gate area 106 and the short dots 105, where the gate area 106 and the short dots 105 are distributed in the nE layer 104. FIG. 3A shows a cross section view (Illustration A) and an overview (Illustration B) of the resultant semiconductor wafer disc at this point. It is noted that Illustration B shows the gate area 106 at this stage as being an exposed pB layer 103 covered with an oxide 150. A close-up overview of the resultant wafer at this point is also shown in FIG. 3B.

Figure 3C:
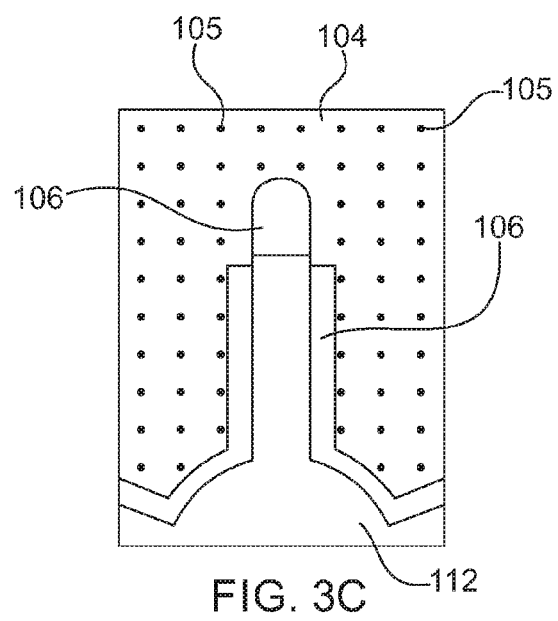
FIG. 3C shows an overview of a portion of the inventive thyristor device after the insulator has been formed.

Step four can include performing photolithography again so that the oxide on the short dots 105 is removed. The oxide on portions of the interdigitated gate area 106 can be similarly removed to form the particular plural parts 113. The particular plural parts 113 can be located near the interdigitated gate electrode 111 and at the outer edge of the nE layer 104 (i.e., at the nE layer periphery). The entire gate area, including the interdigitated gate area 106 but not the particular plural parts 113, can then be covered with an oxide that is the insulator 112. It is noted that in step four, the short dots 105 are not covered with oxide 150 and the gate 106 is an exposed pB layer 103 not covered with an oxide 150. FIG. 3C shows a close-up overview of the resultant wafer at this point.

Figure 3D:
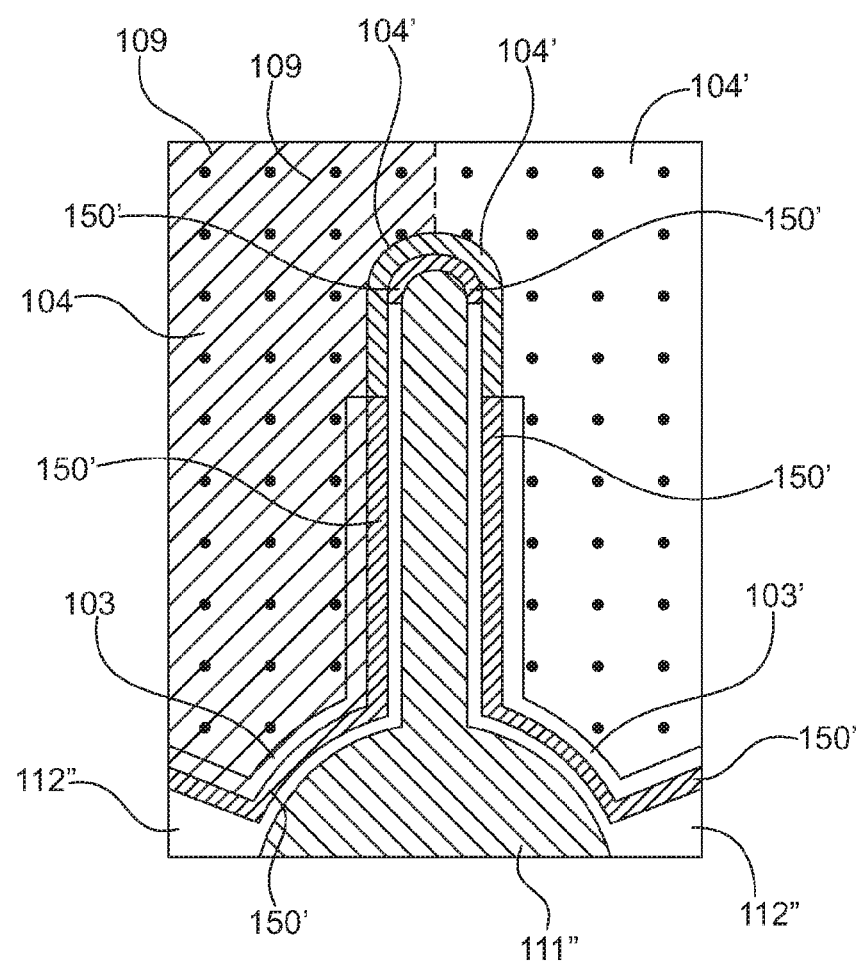
FIG. 3D shows an overview of a portion of the inventive thyristor device after the cathode contact has been disposed on an upper surface of the device.
Figure 4A:
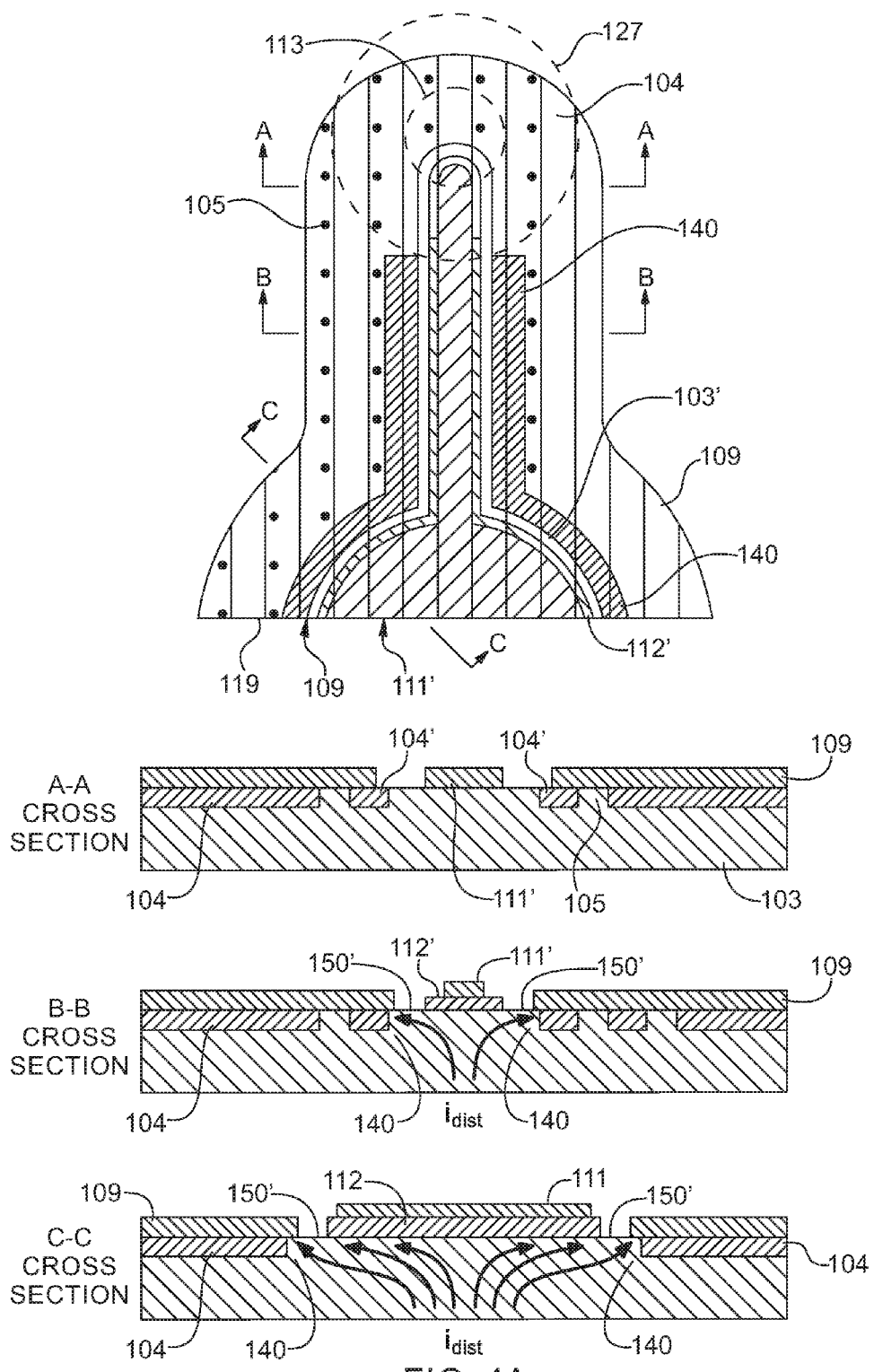
FIG. 4A shows an overview layout of the inventive thyristor device with various cross sectional views to demonstrate the directional flow of the displacement current to the short dots by the oxide insulator to the short dots.

In step five, a cathode electrode 109 may be formed on the nE layer 104 and on the short dots 105 without shortage between the nE layer periphery and the gate area 106. As shown in FIG. 3D, the cathode electrode 109 can cover much of the nE layer 104, and cover much of the pB layer 103 within the gate 106. It should be noted that FIG. 3D shows a bifurcated structure (the left half having the cathode electrode 109 disposed thereon and the right half with the cathode electrode 109 removed) to illustrate the layered structure of the device. In the final assembly, the cathode electrode 109 layer would also extend to the right half, and may be made to mirror the left half. The cathode electrode 109 layer may not cover the nE layer at the tip of the distal end portion 127, and thus form an exposed nE layer 104'. The cathode electrode may also not cover the pB layer 103 underneath the oxide 150, and thus form an exposed oxide layer 150'. The cathode electrode may also not cover the insulation layer 112 or the gate electrode 111, and thus form an exposed insulation layer 112' and gate electrode 111'. In summary, with the exemplary device shown in FIG. 3D, the layers annotated with a primed reference number are the layers that remain exposed (i.e., not covered by the cathode electrode layer 109), but the layers without the primed reference number are layers that are covered by the cathode electrode layer 109. Disposing the cathode electrode 109 may be achieved via aluminum evaporation photolithography or similar process. This layer can then be used to form a cathode contact. The anode electrode 110 can then be formed on at least a portion of the pE layer 102. Afterwards, the gate electrode 111 can be formed on the insulator 112 and on the particular plural parts 113 of the interdigitated gate area 106. The resultant structure exhibits a shorted nE periphery 140. FIG. 4A shows the cathode electrode 109 also covering the pB layer 103 within the shorted nE periphery 140. FIG. 4A also shows the portions that are exposed (i.e., not covered by the cathode electrode 109 layer) by indicating them with a primed reference number.

With the inventive gate structure described herein, gate current provided from outside the gate circuit flows uniformly to the particular plural parts 113 and arrives at each particular plural part 113 simultaneously. Consequently, the turn-on mode of the inventive thyristor device commences with the initial turn-on stage occurring at each particular plural part 113 simultaneously. Further, with the particular plural parts 113 located near the interdigitated gate electrode 111 and within the nE layer 104, the turned-on area of each distal end portion 127 spreads throughout the entire nE layer 104 of the inventive thyristor device in a short amount of time.

FIG. 4A shows the directional flow of the displacement current, $i_{disp}$, by the oxide insulator 112 to the short dots 105. When a dv/dt is applied to the inventive thyristor device, displacement current underneath the insulator 112 is directed to flow to the short dots 105 that are distributed along with nE layer periphery. The gate area 106 is larger than the area shared by the short dots 105 located in the nE layer 104 and, thus, the displacement current flow through the short dots 105 located along the nE layer periphery is greater than the current flow through the short dots 105 located in the nE layer 104. As a result, dv/dt failure occurs at peripheries of the nE layer 104 and the pB layer 103. Consequently, the inventive distributed gate structure can realize at least a few times higher di/dt capability due, in part, to the ability to turn-on each particular plural part 113 simultaneously.

Figure 4B:
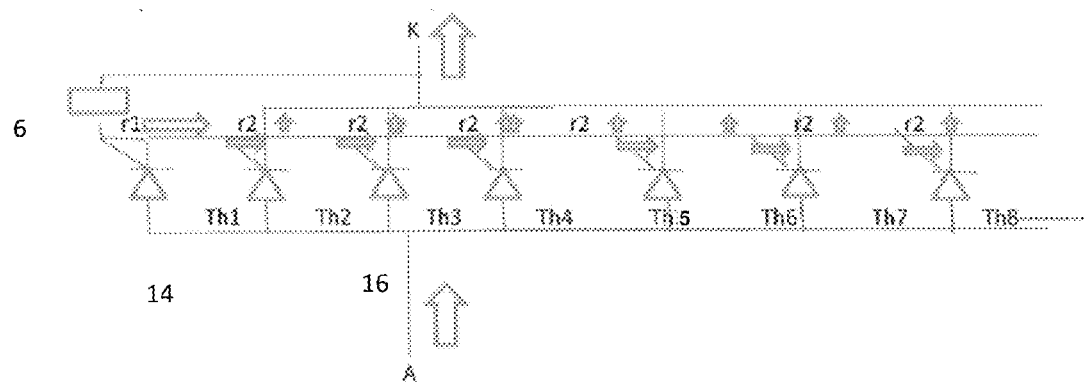
FIGS. 4B-C show a schematic of the prior art gate structure and the current flow through the prior art gate structure, respectively.
Figure 4C:
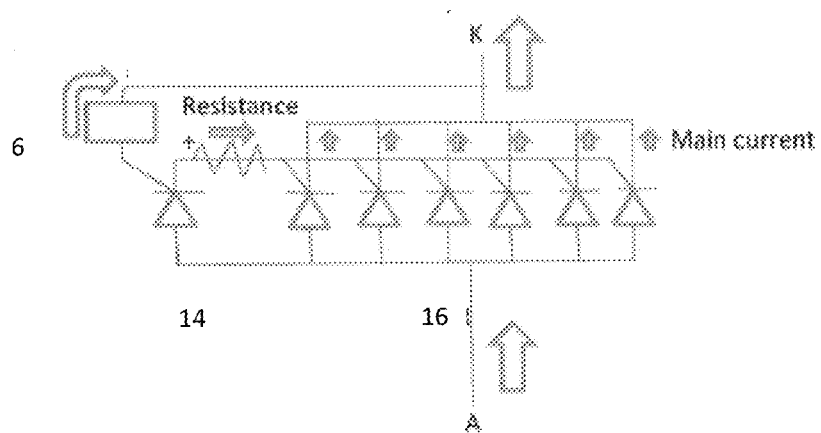

FIGS. 4B-C show a schematic of the prior art gate structure and the current flow through the prior art gate structure, respectively. With the prior art thyristor structure, only the auxiliary SCR is turned on at the initial turn-on stage, where the main SCR subsequently and gradually turns on by the turned-on area slowly spreading to the main SCR. During this time period, the initial rush current flows through the auxiliary SCR, resulting in power loss concentrating at the initial turned-on area of the auxiliary SCR. Further, the resistance between gate and cathode creates a reverse bias voltage to the gate circuit. If the gate to cathode resistance is high, at least a portion of the initial rush current flows through the gate circuit to the cathode. The current flow then causes the gate circuit to bias to in the opposite direction and prevents gate current flow to auxiliary SCR. In other words, bypass main current flow prevents uniform spreading of initial turn-on area surrounding the auxiliary SCR. Further, the small initial turn-on area surrounding the auxiliary SCR does not have enough thermal capacity to maintain the temperature rise that would have to occur to sustain the applied voltage, thereby reducing the di/dt and may further causing the device to fail.

Figure 4D:
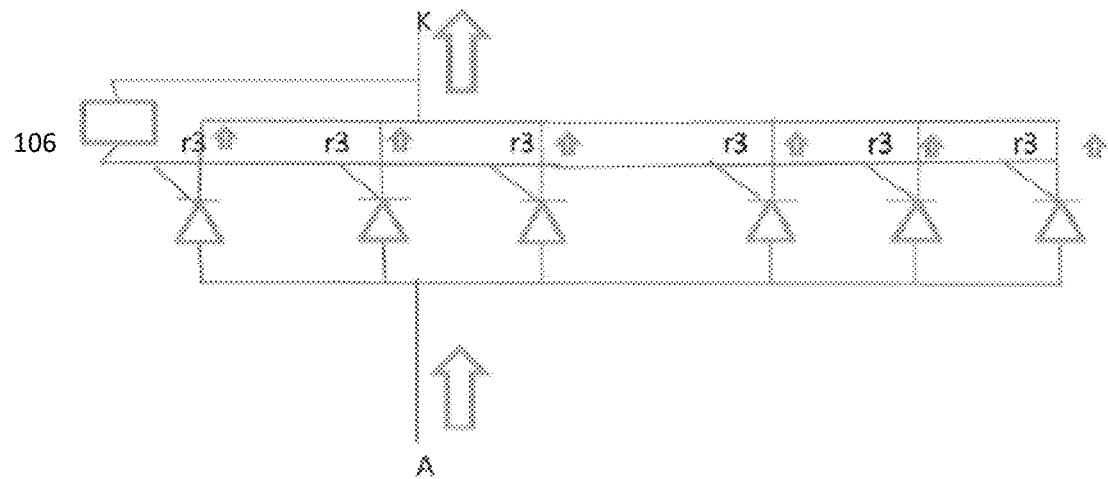
FIGS. 4D-E show a schematic of an exemplary inventive gate structure and the current flow through the inventive gate structure, respectively, using six thyristor units (or SCRs) connected in parallel.
Figure 4E:
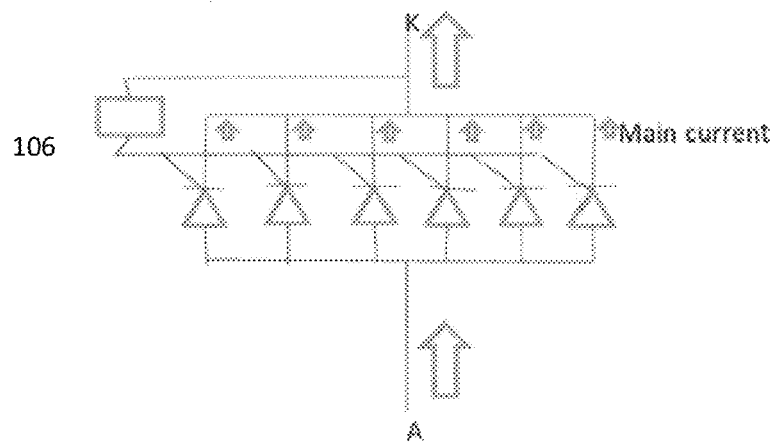

FIGS. 4D-E show a schematic of an exemplary inventive gate structure and the current flow through the inventive gate structure, respectively, using six thyristor units (or SCRs) connected in parallel. As can be appreciated, six SCRs units turn on at the same time. Further, the initial rush current is uniformly distributed to the six SCRs units, resulting in an increased di/dt capability and overcoming the shortcomings of the prior art.

Referring back to FIGS. 2A-2E, in an exemplary embodiment, an inventive thyristor device can include a disc-shaped device comprising four layers of alternating p-n-p-n type material forming a nB layer 101 having a pE layer 102 disposed on one side of the nB layer 101 to form a lower surface 108 and a pB layer 103 disposed on an opposite side of the nB layer 101 to form an upper surface 107. A nE layer 104 can be formed within the pB layer 103. The nE layer 104 can be exposed at the upper surface 107 and the pE layer 102 can be exposed at the lower surface 108. A gate electrode 111 may be formed on at least a portion of the pB layer 103. The gate electrode 111 can exhibit a hub 120 and interdigitated shape in which a hub 120 and spoke 125 configuration is formed, wherein each spoke 125 can include an arm 126 and a distal end portion 127. The hub portion 120 of the gate electrode 111 can be the external gate lead contact point. A region of space beneath the gate electrode 111 and within the nE layer 104 and/or the pB layer 103 can be the gate area 106, wherein the gate area 106 can be exposed to the upper surface 107. At least one short dot 105 can be formed into the nE layer 104. In some embodiments, at least one short dot 105 is located adjacent the gate area 106. A region of the nE layer 104 that is adjacent the short dots 105 and most proximal the gate area 106 can form the nE layer periphery, where the nE layer periphery can be made to surround the gate area 106. The cathode electrode 109 may be disposed on at least a portion of the upper surface 107, which may include being disposed over a region(s) where the short dots 210 are located. Further, the cathode electrode 109 can be formed by a low ohmic resistance metal making ohmic contact with the exposed nE layer 104. The anode electrode 110 may be disposed on at least a portion of the lower surface 108. Further the anode electrode 110 can be formed by a low ohmic resistance metal making ohmic contact with the exposed pE layer 102. Region(s) of the nB layer 101 underneath the portions where the short dots 105 are located can form the main thyristor region 116 or the main emitter region.

At least one particular plural part 113 can be formed within the nE layer 104 adjacent the gate area 106 within at least one distal end portion 127. In at least one embodiment, each distal end portion 127 and the particular plural parts 113 are located at a distance from the hub 120 or the external gate lead contact point so that the spreading pattern of each turned-on area generates a turned-on area for the entire device at one time. The resistance from the external gate contact point to a particular plural parts 113 can be equivalent to a resistance from the external gate contact point to each other particular plural parts 113. In some embodiments, the resistance from the external gate contact point to each particular plural parts 113 can be such that the gate current flowing from the external gate contact point to each particular plural parts 113 is uniform.

At least one particular plural part 113 can be formed so as to be between the gate electrode 111 and/or gate area 106 and the cathode electrode 109 and/or nE layer periphery most proximal the gate electrode 111 and/or gate area 106. The oxide insulator 102 can be formed underneath the gate electrode 111 and/or on top of the gate area 106, except at the distal end portion 127. In some embodiments, the oxide insulator 102 can be formed underneath the gate electrode 111 to cover the entire gate area 106, except the particular plural parts 113.

Each distal end portion 127 can be configured as an individual thyristor unit Th, wherein a cross section of each thyristor unit Th includes the gate electrode 111 located on top of the gate area 106 without the insulator 112, at least one particular plural part 113 positioned adjacent the gate area 106 and within the nE periphery 140 most proximal the gate area 106, and at least one short dot 105 adjacent the at least one particular plural parts 113. The individual thyristor unit Th can further include at least one main thyristor region 106 within the nB layer 101 underneath each short dot 105 located on either side of the gate electrode 111. The individual thyristor unit Th can further include the cathode electrode 109 at the upper surface 107 and the anode electrode 110 at the lower surface 108.

The hub 120 and spoke 125 gate electrode 111 can be structured to connect each individual thyristor unit Th in parallel so as to supply each individual thyristor unit Th simultaneously with a gate current that is equal in magnitude. Further, the insulator 112 under the gate electrode 111 can direct displacement current to the short dots 105 while the gate current is directed to the distal end portions 127 so that gate current does not flow directly into the main thyristor periphery 118, but rather flows to the particular plural part 113 of each distal end portion 127. Further, the insulator 112 under the gate electrode 111 can direct displacement current to the short dots 105 while the gate current is directed to the distal end portions 127 so that gate current is directed to the nE layer periphery that surrounds the gate area 106 unevenly by supplying the gate current only to the particular plural parts 113.

Each thyristor unit Th can be located within the disc-shaped device so that when the gate current causes each individual thyristor unit Th to turn on, a turned-on area radiates from each individual thyristor unit to generate a plural distribution framework. Each distal end portion 127 can be positioned so that each of the individual turned-on areas of the plural distribution framework radiate or spread so as to turn on each the main thyristor region 116, or at least a substantial portion of each main thyristor region 116, at the same time.

Figure 5A:
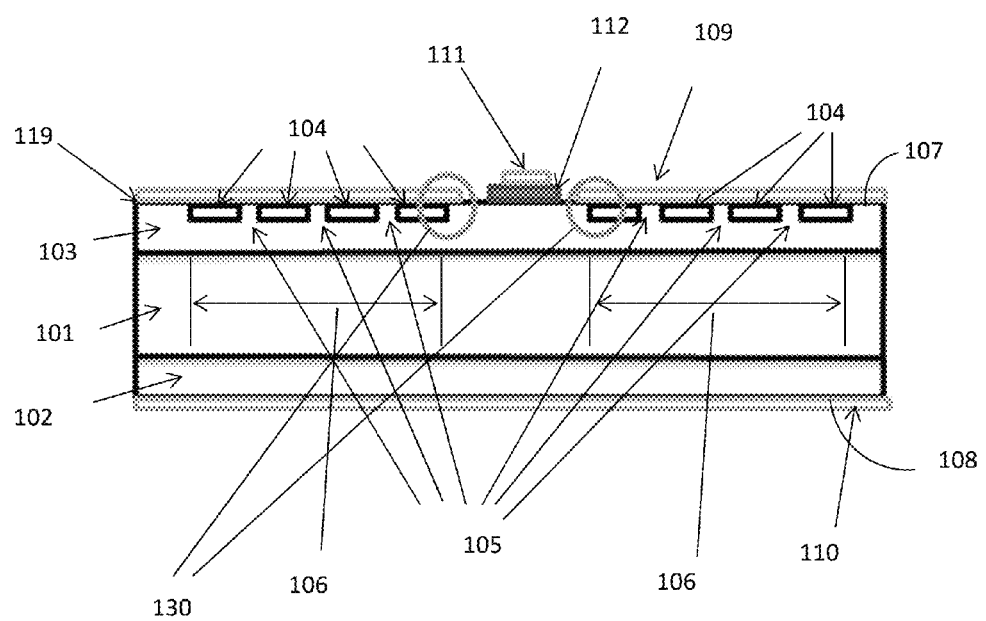
FIGS. 5A-5B show a cross section along a B-B line and a cross section along the C-C line of FIG. 2A, respectively, of a first alternative inventive thyristor device having an extended p-base layer being shorted to the main cathode electrode to form an nE-pB short.
Figure 5B:
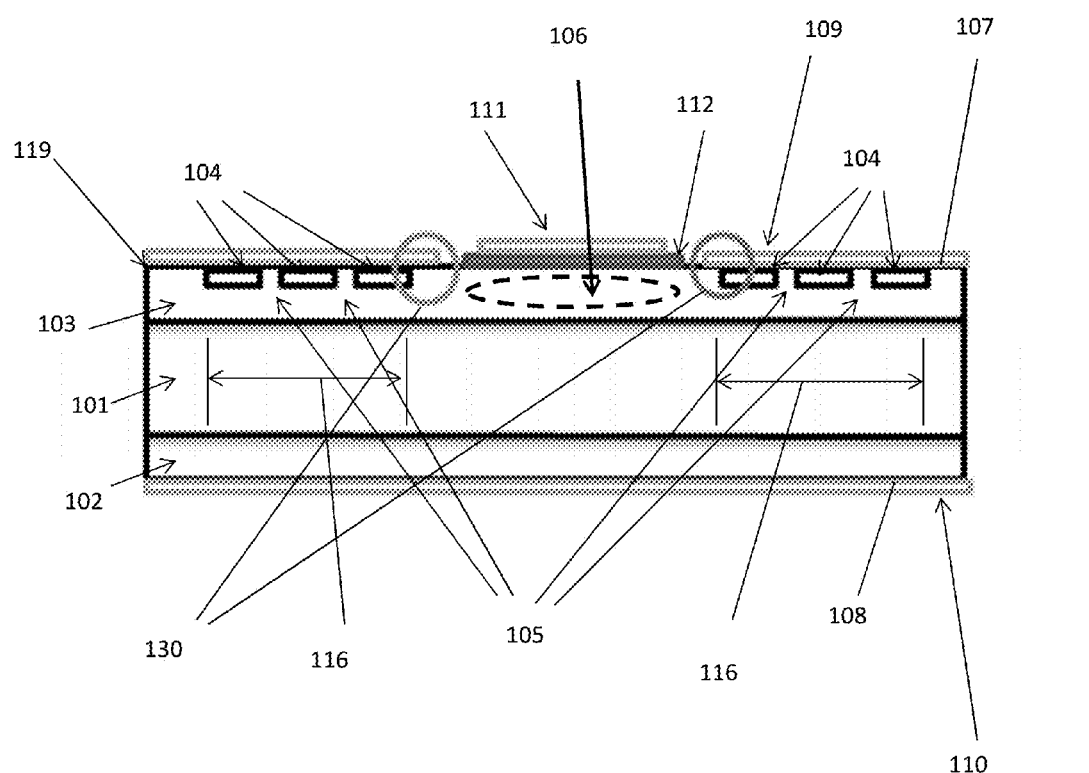

Referring now to FIGS. 5A-5B, a first alternative inventive thyristor device is disclosed with an extended p-base layer 103 being shorted to the cathode electrode 109 to form a nE-pB short 130, wherein FIG. 5A shows a cross section along a B-B line and FIG. 5B shows a cross section along the C-C line. Note, the B-B line and C-C line cross sections referenced in FIGS. 5A-5B are the same geometric plane line cross sections shown in FIG. 2A, but are views of the first alternative inventive thyristor device structure having an extended p-base layer 103 being shorted to the main cathode electrode 109 by a nE-pB short 130. As will be explained in detail below, the structure of the first alternative inventive thyristor may be used to further increase the dv/dt capability of the inventive thyristor in addition to increasing the di/dt capability.

As noted above, the inventive thyristor device can have an interdigitated gate electrode 111 structure and a short dot 105 layout at the main thyristor periphery 118. If the interdigitated gate electrode 111 structure includes a wide gate area 106, then a weak or low dv/dt capability may result. However, the dv/dt capability can be increased by shorting the extended p-base layer 103 from underneath the insulator 112, thereby creating a nE-pB short 130. The nE-pB short 130 can be created by shorting the pB layer 103 to the cathode electrode 109 via a metalized layer. In other words, the pB layer 103 near the gate area 106 and the nE layer 104 can be shorted by the cathode electrode 109, except for the particular plural parts 113 and except for the area near the particular plural parts 113. By shorting the pB layer 103, which is extended from underneath the insulator 112, displacement current due to dv/dt flows from the pB layer 103 and directly to the shorted cathode electrode 109. Shorting the pB layer 103 in such a manner can increase the dv/dt capability without influencing the di/dt capability or the turned-on functionality at any of the particular plural parts 113. For example, the nE-pB short 130 shorts the periphery of the pB-nE junction 119 existing along the insulator 112 to the cathode electrode 109, except at the particular plural parts 113, so that displacement current directly flows to the cathode electrode 109 without going through the short dots 105 existing along with periphery of the nE layer 104 and pB layer 103. As the result, both the di/dt capability and the dv/dt capability are remarkably improved without any effect on the turn-on capability.

A first alternative inventive 6.5 kV thyristor device having the configuration set forth in FIGS. 5A-5B can exhibit a di/dt capability greater than 600 A/μs and a dv/dt capability greater than 4 kV/μs. Further, it has been shown that the di/dt capability of a 6.5 kV first alternative inventive thyristor device can be as high as 400 A/μs at a 6 kV switching voltage, with a dv/dt capability as high as 3 kV/μs at a 6 kV reapply voltage.

The inventive thyristor device and the first alternative inventive thyristor device, both of which have no auxiliary thyristor structure, can solve the holding current problem of conventional thyristors that do include an auxiliary thyristor structure. Generally, there are two kinds of di/dt failure modes for thyristors that have an auxiliary thyristor. One is di/dt failure at the gate periphery of the auxiliary thyristor. This failure may be caused by current concentration at the gate periphery, where current does not spread to the main thyristor area. The other is failure of the main thyristor periphery. This occurs after current spreads to the main thyristor from the auxiliary thyristor. In a practical circuit of high voltage thyristor application, series connection of capacitance and a resistor circuit (snubber circuit) are connected in parallel to the thyristor. The purpose for this may be to reduce dv/dt to the thyristor during actual operation and to decrease dv/dt failure by exceeding dv/dt of the capability during operation. In high power circuit applications, inductance of main circuit can be very high and the C-R snubber's time constant is typically small. Thus, the duration of the actual turn on gate pulse can be around 10 μs. When the gate pulse applies, high di/dt current rushes from the C-R snubber and flows to the thyristor due to such circuit conditions. As a result no more gate current applies to the thyristor, and current from the snubber moves from the auxiliary thyristor to the main thyristor periphery. The tail current of the snubber current is smaller than the holding current of the auxiliary thyristor, so the main current flows only to certain spots of periphery of the main thyristor, causing the main current to concentrate at that spot. As the result of this concentration of current, that one spot is destroyed.

Figure 6A:
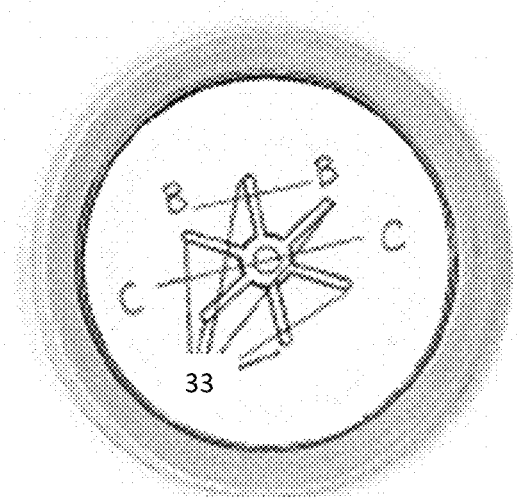
FIG. 6A shows a top view of the second alternative inventive thyristor including an auxiliary thyristor structure.
Figure 6B:
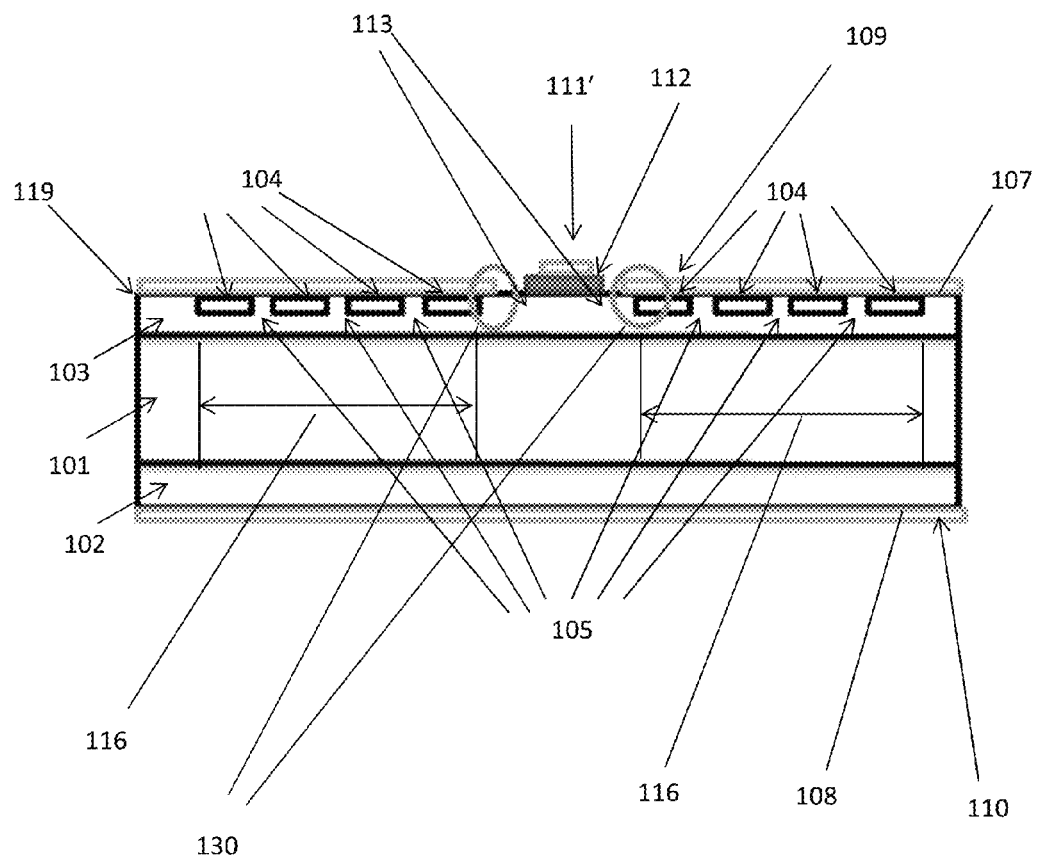
FIGS. 6B-6C show cross sectional views along the B-B line and C-C line, respectively, of the second alternative inventive thyristor of FIG. 6A.
Figure 6C:
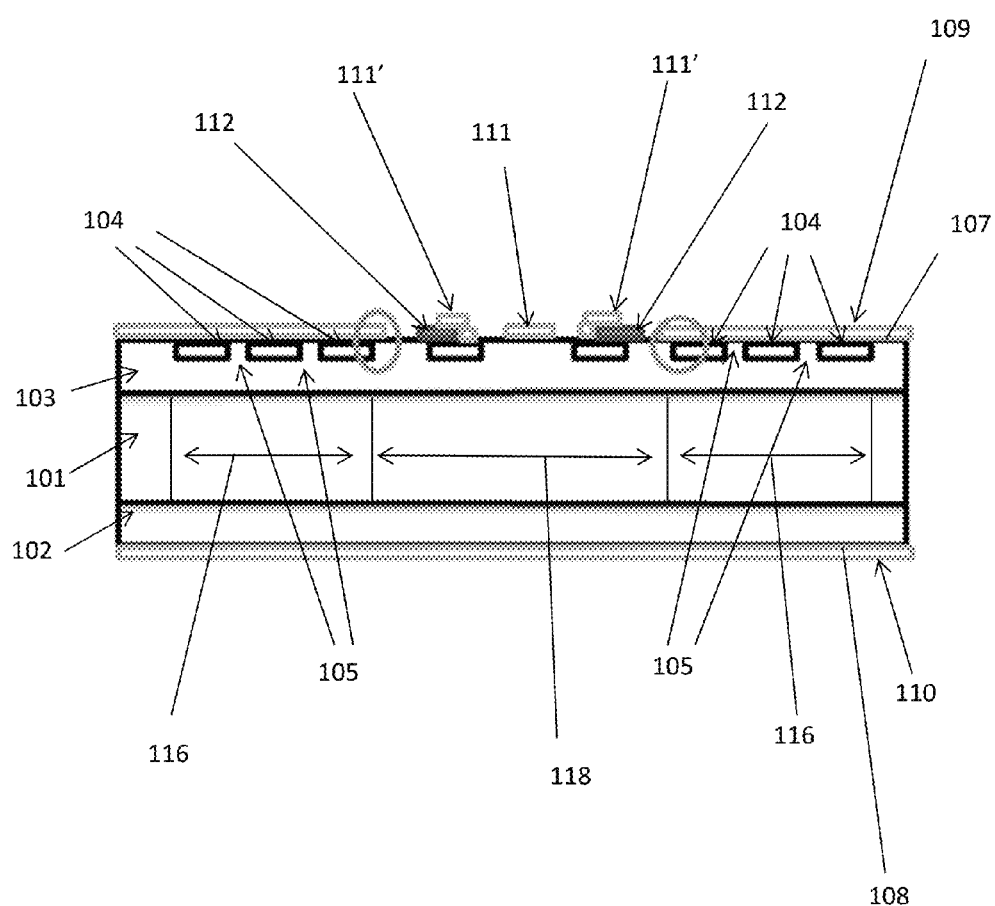

A second alternative inventive thyristor device having an auxiliary thyristor included with the first alternative inventive thyristor gate structure is shown in FIGS. 6A-6C. FIG. 6A shows a top view of the second alternative inventive thyristor. FIGS. 6B-6C show cross sectional views along the B-B line and C-C line, respectively, of the second alternative inventive thyristor of FIG. 6A. Similar elements with respect to previous Figures are indicated with the same reference number, and those modified are indicated with a prime ('). An auxiliary electrode 111' is connected to the nE layer 104 of auxiliary thyristor and extends to the at least one particular plural part 113 located adjacent the insulator 112 without an ohmic contact, except at the particular plural parts 113. The periphery of the pB-nE junction 119 existing along with the insulator 112 is shorted by the cathode electrode 109 except for the particular plural parts 113 in that region. The second alternative inventive thyristor device can include a gate electrode 111 with an auxiliary nE layer surrounding the gate electrode 111. Further, an auxiliary emitter electrode is in ohmic contact with the auxiliary nE layer, where the auxiliary emitter electrode extends to the particular plural part 113 on the insulator 112. With this structure, the di/dt capability is increased beyond any conventional thyristor.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range, including the end points.

I claim:

1. A thyristor device, comprising:
    a semiconductor structure with alternating p-n-p-n layers, the alternating p-n-p-n layers comprising:
        a nB layer having a pE layer disposed on one side of the nB layer to form a lower surface of the semiconductor structure;
        a pB layer disposed on an opposite side of the nB layer to form an upper surface of the semiconductor structure; and,
        a nE layer formed within the pB layer;
        wherein a gate area is a portion of the pB layer, which is located adjacent the nE layer, and the nE layer surrounds the gate area;
        wherein the nE layer is exposed to the upper surface and the pB layer is exposed to the lower surface;
    a cathode electrode located on at least a portion of the upper surface and formed by a first low ohmic resistance metal making ohmic contact with at least the nE layer;
    an anode electrode located on at least a portion of the lower surface and formed by a second low ohmic resistance metal making ohmic contact at least the pE layer and;
    a gate electrode formed on at least a portion of the pB layer so as to be disposed over the gate area; and
    wherein gate current entering the gate electrode flows to at least one particular plural part, which is located between the gate area and the nE layer to charge the alternating p-n-p-n layers and generate an initial turned-on area emanating from each of the at least one particular plural part.

2. The thyristor device recited in claim 1, wherein:
    the gate is formed as a hub with at least one spoke extending from the gate;
    each spoke forms an interdigitated gate electrode; and,
    each spoke comprises an arm and a distal end with the at least one particular plural part located at each distal end.

3. The thyristor device recited in claim 2, further comprising an insulator layer formed on top of at least a portion of the gate and underneath at least a portion of the gate electrode.

4. The thyristor device recited in claim 3, further comprising at least one short dot formed into the pB layer, wherein the insulator layer directs displacement current to the at least one short dot.

5. The thyristor device recited in claim 4, wherein each distal end is structured as an individual thyristor unit connected in parallel.

6. The thyristor device recited in claim 5, wherein a length and resistance of each arm is configured to supply a same magnitude of current to each individual thyristor unit simultaneously.

7. The thyristor device recited in claim 6, wherein:
    the insulator is formed on top of the gate except over the at least one particular plural part; and
    the gate electrode is an aluminum or other electrode metal formed on top of the insulator and on top of the at least one particular plural part.

8. The thyristor device recited in claim 7, wherein the gate electrode makes ohmic contact with at least a portion of the at least one particular plural part, and wherein a remaining portion of the gate electrode is insulated from the gate by the insulator.

9. The thyristor device recited in claim 8, wherein the gate electrode is a gate contact for the thyristor device.

10. The thyristor device recited in claim 9, wherein the pB layer near the gate and the nE layer is shorted by the cathode electrode, except for the at least one particular plural part and except for an area near the at least one particular plural part.

11. The thyristor device recited in claim 9, further comprising an auxiliary thyristor structure formed by an auxiliary thyristor electrode connected to the nE layer that extends to the at least one particular plural part.

12. The thyristor device recited in claim 11, wherein the auxiliary thyristor structure further comprises an auxiliary nE layer surrounding the auxiliary thyristor electrode, and wherein the auxiliary thyristor electrode makes ohmic contact with the auxiliary nE layer.

13. The thyristor device recited in claim 11, wherein the pB layer near the gate and the nE layer is shorted by the cathode electrode, except for the at least one particular plural part and except for an area near the at least one particular plural part.

14. A thyristor device, comprising:
a disc-shaped device comprising four layers of alternating p-n-p-n type material forming a nB layer having a pE layer disposed on one side of the nB layer to form a lower surface and a pB layer disposed on an opposite side of the nB layer to form an upper surface;
a nE layer formed within the pB layer, wherein nE layer is exposed at the upper surface and the pE layer is exposed at the lower surface;
at least one gate electrode formed on at least a portion of the pB layer, each gate electrode extending from a gate area and comprising an arm portion and a distal end portion, wherein the gate area is an external gate lead contact point;
at least one short dot formed into the nE layer and located adjacent the gate area, wherein a region of the nE layer that is adjacent the at least one short dot and most proximal the gate area is a nE layer periphery and the nE layer periphery surrounds the gate area;
a cathode electrode disposed on at least a portion of the upper surface, the cathode electrode formed by a first low ohmic resistance metal making ohmic contact with the nE layer;
an anode electrode disposed on at least a portion of the lower surface, the anode electrode formed by a second low ohmic resistance metal making ohmic contact with the pE layer;
at least one particular plural part located at each distal end portion and formed into the nE layer adjacent the gate area; and
an oxide insulator layer formed underneath at least a portion of the gate electrode and on top of at least a portion of the gate area, except at each distal end;
wherein each distal end is configured as an individual thyristor unit.

15. The thyristor device recited in claim 14, wherein each thyristor unit is connected in parallel.

16. The thyristor device recited in claim 14, wherein the length and resistance of each arm are set to simultaneously provide each thyristor unit with a same magnitude current flowing into the thyristor device through the external gate lead contact point.

17. The thyristor device recited in claim 14, wherein the at least one particular plural part is located between the gate and the nE layer periphery of each distal end.

18. The thyristor device recited in claim 16, wherein each thyristor unit is located at a position within the disc-shaped device so that when the current flowing into the thyristor device through the external gate lead contact point reaches each individual thyristor unit, a turned-on area radiates from each individual thyristor unit to generate a plural distribution framework.

19. The thyristor device recited in claim 14, further comprising an extended p-base layer shorted to the cathode electrode by a metallization layer, wherein the pB layer near the gate area and the nE layer is shorted by the cathode electrode, except for the at least one particular plural part and except for an area near the at least one particular plural part.

20. The thyristor device recited in claim 14, further comprising an auxiliary electrode connected to the nE layer and extending to the at least one particular plural part.

21. A thyristor device, comprising:
a pE layer, a nE layer, a pB layer, and a nB layer, forming a first silicon surface and a second silicon surface;
wherein:
the nE layer is exposed at the first silicon surface and the pE layer is exposed at the second silicon surface;
both the nE layer and the pE layer make ohmic contact with a low ohmic resistance metal to form a cathode electrode and an anode electrode;
the gate area is part of the pB layer, which is also exposed to the first silicon surface, the gate area existing beside a periphery of the nE layer so that the exposed nE layer surrounds the gate area, the exposed gate area forming an interdigital finger shape into the nE layer; and,
gate current flowing through the thyristor device does not evenly supply the nE periphery along the interdigital gate area and just supplies the gate current only to particular plural parts facing toward the nE layer.

22. The thyristor device recited in claim 21, further comprising:
the particular plural parts with a periphery of the interdigital finger are away from an external gate lead contact point of the thyristor device; and
resistance from the gate lead contact point to the particular plural points is equivalent to each other, wherein the gate current just flows through the particular plural parts and flows evenly.

23. The thyristor device recited in claim 21, further comprising:
an insulator disposed onto the exposed gate except for at least a particular plural part or a plural of the exposed gate area; and
aluminum or other metal electrode is formed onto the insulator and on the exposed particular plural part or plural gate of the interdigital pB layer, wherein the aluminum contacts ohmically and partially to the exposed the gate and another part of the aluminum is isolated by the insulator;
wherein the aluminum on the insulator and exposed gate comprises a gate contact of the thyristor device.

24. The thyristor device recited in claim 21, wherein a periphery of the exposed gate and the nE layer are at least shorted by the cathode electrode except near an area of the exposed gate and except the exposed gate.

25. The thyristor device recited in claim 21, further comprising an auxiliary thyristor, wherein:
the auxiliary thyristor comprises a gate electrode and an auxiliary nE layer that surrounds the gate electrode; and
the gate electrode and an auxiliary emitter electrode ohmically contacts to the nE layer of the auxiliary thyristor and the auxiliary electrode extends to the particular plural parts on the insulator.

26. The thyristor device recited in claim 21, wherein a periphery of the exposed gate and the nE layer are at least shorted by the cathode electrode except near an area of the exposed plural particular parts and the exposed plural particular parts.

* * * * *